United States Patent
Petrov

(10) Patent No.: US 11,329,672 B2
(45) Date of Patent: *May 10, 2022

(54) PARALLEL BIT INTERLEAVER

(71) Applicant: Panasonic Corporation, Osaka (JP)

(72) Inventor: Mihail Petrov, Bavaria (DE)

(73) Assignee: PANASONIC CORPORATION, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/144,275

(22) Filed: Jan. 8, 2021

(65) Prior Publication Data

US 2021/0135687 A1 May 6, 2021

Related U.S. Application Data

(63) Continuation of application No. 16/385,218, filed on Apr. 16, 2019, now Pat. No. 10,931,313, which is a (Continued)

(30) Foreign Application Priority Data

May 18, 2011 (EP) .................................... 11004126

(51) Int. Cl.
*H03M 13/00* (2006.01)
*H03M 13/27* (2006.01)
(Continued)

(52) U.S. Cl.
CPC ..... *H03M 13/2792* (2013.01); *H03M 13/116* (2013.01); *H03M 13/1134* (2013.01);
(Continued)

(58) Field of Classification Search
CPC ......... H03M 13/2792; H03M 13/1134; H03M 13/116; H03M 13/1165; H03M 13/255;
(Continued)

(56) References Cited

U.S. PATENT DOCUMENTS 6,751,269 B1 6/2004 Shalvi et al.
7,555,694 B2 6/2009 Kyung et al.
(Continued)

FOREIGN PATENT DOCUMENTS

CN 1794521 6/2006
CN 1836394 9/2006
(Continued)

OTHER PUBLICATIONS

International Search Report dated Jul. 31, 2012 in International (PCT) Application No. PCT/JP2012/003260.
(Continued)

*Primary Examiner* — Christine T. Tu
(74) *Attorney, Agent, or Firm* — Wenderoth, Lind & Ponack, L.L.P.

(57) ABSTRACT

A bit interleaving method involves applying a bit permutation process to a QC LDPC codeword made up of N cyclic blocks each including Q bits, and dividing the codeword, after the bit permutation process, into a plurality of constellation words each made up of M bits, the codeword being divided into N/M sections, each constellation word being associated with one of the N/M sections, and the bit permutation process being performed such that each of the constellation words includes one bit from each of M different cyclic blocks associated with a given section.

2 Claims, 29 Drawing Sheets

Related U.S. Application Data continuation of application No. 16/122,466, filed on Sep. 5, 2018, now Pat. No. 10,312,942, which is a continuation of application No. 15/711,202, filed on Sep. 21, 2017, now Pat. No. 10,097,212, which is a continuation of application No. 15/388,192, filed on Dec. 22, 2016, now Pat. No. 9,800,270, which is a continuation of application No. 15/156,698, filed on May 17, 2016, now Pat. No. 9,564,929, which is a continuation of application No. 14/843,031, filed on Sep. 2, 2015, now Pat. No. 9,369,153, which is a continuation of application No. 14/681,442, filed on Apr. 8, 2015, now Pat. No. 9,160,372, which is a continuation of application No. 14/116,608, filed as application No. PCT/JP2012/003260 on May 18, 2012, now Pat. No. 9,032,260.

(51) Int. Cl.

| | |
|---|---|
| *H03M 13/11* | (2006.01) |
| *H03M 13/25* | (2006.01) |
| *H03M 13/29* | (2006.01) |
| *H03M 13/35* | (2006.01) |
| *H04L 1/00* | (2006.01) |

(52) U.S. Cl.
CPC ..... *H03M 13/1165* (2013.01); *H03M 13/255* (2013.01); *H03M 13/27* (2013.01); *H03M 13/271* (2013.01); *H03M 13/296* (2013.01); *H03M 13/356* (2013.01); *H03M 13/6552* (2013.01); *H04L 1/0041* (2013.01); *H04L 1/0045* (2013.01); *H04L 1/0058* (2013.01); *H04L 1/0061* (2013.01); *H04L 1/0071* (2013.01)

(58) Field of Classification Search
CPC .. H03M 13/27; H03M 13/271; H03M 13/296; H03M 13/356; H03M 13/6552; H03M 13/1162; H03M 13/1174; H03M 13/2948; H04L 1/0041; H04L 1/0045; H04L 1/0058; H04L 1/0061; H04L 1/0071
See application file for complete search history.

(56) References Cited

U.S. PATENT DOCUMENTS

| | | | |
|---|---|---|---|
| 7,752,529 | B2 | 7/2010 | Lee |
| 8,219,874 | B2 | 7/2012 | Djordjevic et al. |
| 8,359,522 | B2 | 1/2013 | Gunnam et al. |
| 8,433,984 | B2 | 4/2013 | Khandekar |
| 8,566,668 | B1 | 10/2013 | Dave |
| 8,713,398 | B2 | 4/2014 | Kamiya |
| 8,739,001 | B2 | 5/2014 | Tsatsaragkos |
| 8,918,697 | B2 | 12/2014 | Yang |
| 8,930,789 | B1 | 1/2015 | Dave et al. |
| 9,160,372 | B2 | 10/2015 | Petrov |
| 9,369,153 | B2 | 6/2016 | Petrov |
| 9,564,929 | B2 | 2/2017 | Petrov |
| 9,787,326 | B2 | 10/2017 | Jeong |
| 9,800,270 | B2 | 10/2017 | Petrov |
| 10,270,467 | B2 | 4/2019 | Jeong et al. |
| 10,931,313 | B2* | 2/2021 | Petrov ............... H03M 13/271 |
| 2004/0246888 | A1 | 12/2004 | Peron |
| 2005/0050435 | A1 | 3/2005 | Kyung et al. |
| 2006/0107181 | A1 | 5/2006 | Dave |
| 2007/0033486 | A1 | 2/2007 | Hong et al. |
| 2008/0104474 | A1 | 5/2008 | Gao |
| 2009/0125780 | A1 | 5/2009 | Taylor et al. |
| 2009/0282316 | A1 | 11/2009 | Lingam et al. |
| 2010/0211849 | A1* | 8/2010 | Djordjevic .......... H03M 13/255 |
| | | | 714/755 |
| 2010/0257426 | A1 | 10/2010 | Yokokawa et al. |
| 2010/0275101 | A1 | 10/2010 | Yokokawa et al. |
| 2010/0281329 | A1 | 11/2010 | Yokokawa et al. |
| 2010/0325512 | A1 | 12/2010 | Yokokawa et al. |
| 2011/0047433 | A1 | 2/2011 | Abu-Surra |
| 2011/0276860 | A1 | 11/2011 | Lei et al. |
| 2012/0266040 | A1 | 10/2012 | Hamkins |
| 2014/0010154 | A1* | 1/2014 | Hong ................... H04H 60/73 |
| | | | 370/328 |
| 2015/0010117 | A1 | 1/2015 | Myung |
| 2015/0341048 | A1 | 11/2015 | Park |
| 2016/0072523 | A1 | 3/2016 | Muhammad |
| 2016/0094895 | A1 | 3/2016 | Stadelmeier |
| 2016/0164635 | A1 | 6/2016 | Moon |
| 2016/0233886 | A1 | 8/2016 | Jeong |
| 2016/0345028 | A1 | 11/2016 | Kim |
| 2017/0163290 | A1 | 6/2017 | Kim |
| 2017/0230061 | A1 | 8/2017 | Zhang |

FOREIGN PATENT DOCUMENTS

| | | |
|---|---|---|
| CN | 1917399 | 2/2007 |
| CN | 101047840 | 10/2007 |
| CN | 101488819 | 7/2009 |
| CN | 101510865 | 8/2009 |
| EP | 2 254 249 | 11/2010 |
| EP | 2 254 250 | 11/2010 |
| EP | 2 525 496 | 11/2012 |
| EP | 2 566 054 | 3/2013 |
| JP | 2008-125085 | 5/2008 |
| WO | 2009/116204 | 9/2009 |
| WO | 2010/004382 | 1/2010 |

OTHER PUBLICATIONS

Catherine Douillard et al., "The Bit Interleaved Coded Modulation Module for DVB-NGH: Enhanced features for mobile reception", Telecommunications (ICT), 2012 19th International Conference on Apr. 23, 2012.

"Digital Video Broadcasting (DVB); Second generation framing structure, channel coding and modulation systems for Broadcasting, Interactive Services, News Gathering and other broadband satellite applications (DVB-S2)", ETSI EN 302 307, V1.2.1 (Aug. 2009).

"Digital Video Broadcasting (DVB); Frame structure channel coding and modulation for a second generation digital terrestrial television broadcasting system (DVB-T2)", ETSI EN 302 755, V1.2.1 (Feb. 2011).

"Digital Video Broadcasting (DVB); Frame structure channel coding and modulation for a second generation digital transmission system for cable systems (DVB-C2)", Final draft ETSI EN 302 769 V1.2.1 (Dec. 2010).

"Digital Video Broadcasting (DVB); Framing structure, channel coding and modulation for digital terrestrial television", ETSI EN 300 744 V1.6.1 (Jan. 2009).

Frank Kienle et al., "Macro Interleaver Design for Bit Interleaved Coded Modulation with Low-Density Parity-Check Codes", Proc, IEEE Vehicular Technology Conference, VTC, Spring 2008, May 11, 2008, pp. 763-766.

Hua Rui et al., "Performance of Belief Propagation Coded Modulation with Iterative Decoding", Proc. IEEE International Conference on Communications, Circuits and Systems, ICCCAS 2004, Chengdu, China, Jun. 27, 2004-Jun. 29, 2004, pp. 71-74, vol. 1, figure 1.

Takashi Yokokawa et al., "Parity and Column Twist Bit Interleaver for DVB-T2 LDPC Codes", 2008 5th International Symposium on Turbo Codes and Related Topics, Brest, France, Sep. 1, 2008, pp. 123-127.

Jing Lei et al., "Demultiplexer Design for Multi-Edge Type LDPC Coded Modulation", Information Theory, 2009, ISIT 2009, IEEE International Symposium on, IEEE Piscataway, NJ, USA, Jun. 28, 2009, pp. 933-937.

Dariush Divsalar et al., "Protograph Based Low Error Floor LDPC Coded Modulation", Proc., IEEE Conference on Military Communications, MILCOM 2005, Atlantic City, NJ, USA, Oct. 17, 2005-Oct. 20, 2005, pp. 1-8.

(56) References Cited

OTHER PUBLICATIONS

European Search Report dated Nov. 3, 2011 in European Application No. EP 11 00 4126.
Supplementary European Search Report dated May 27, 2013 in European Application No. EP 12 78 6306.
Office Action dated Dec. 13, 2019 in Chinese Patent Application No. 201610889133.8 with partial English-language translation.
Office Action dated Mar. 5, 2020 in Chinese Patent Application No. 201610890041.1, with partial English Translation.

* cited by examiner

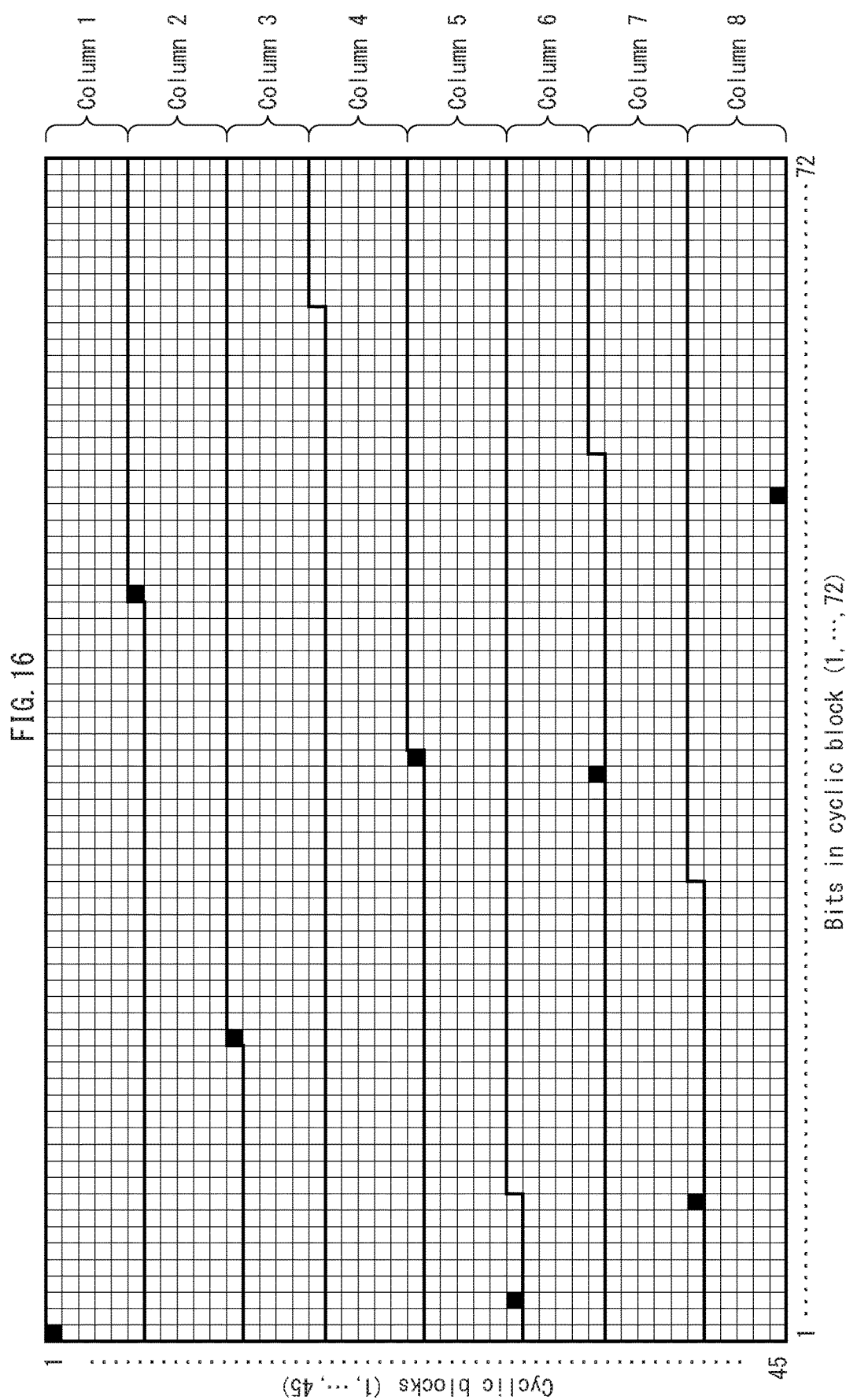

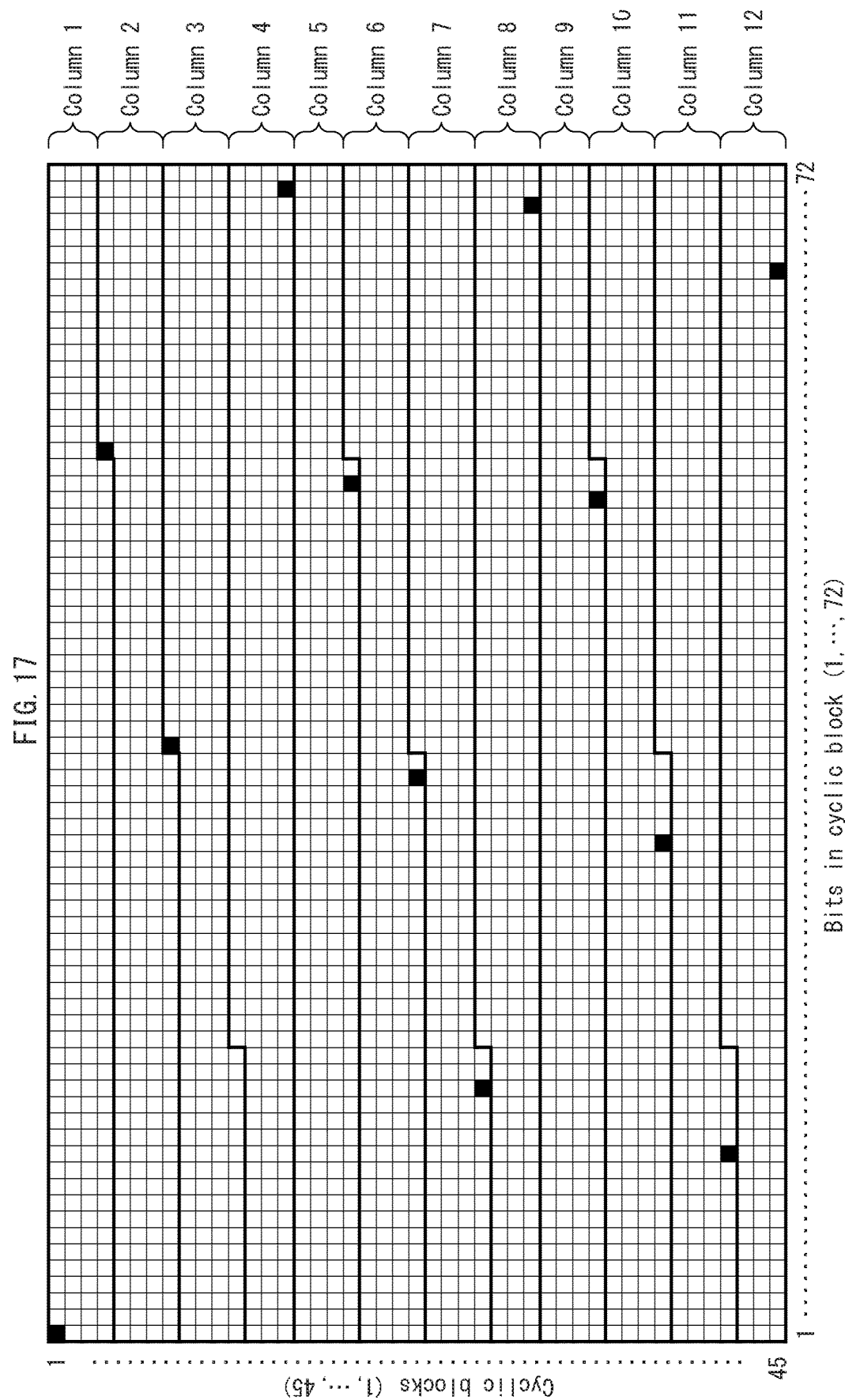

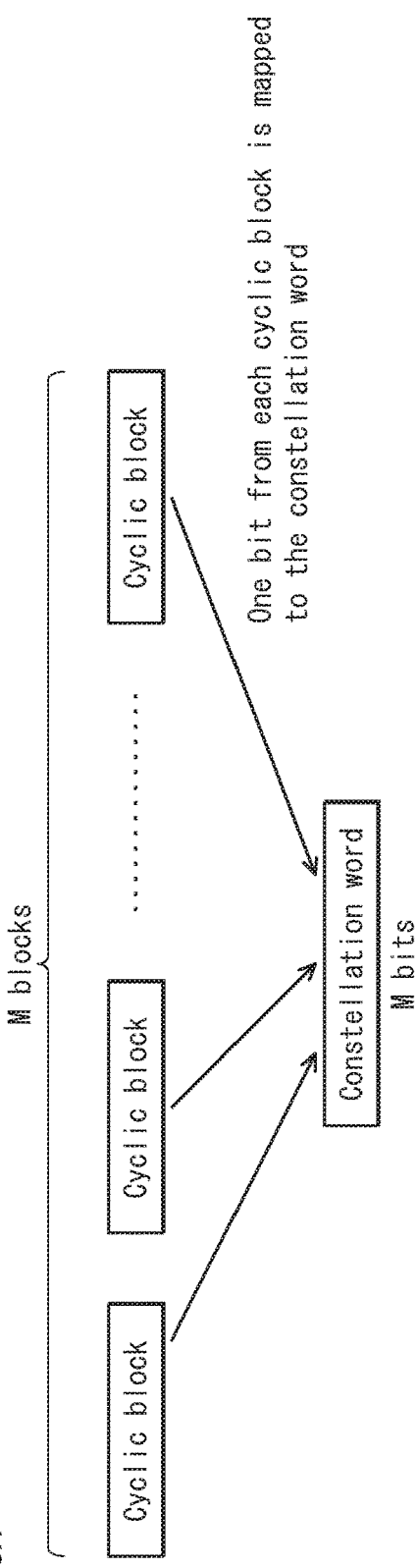
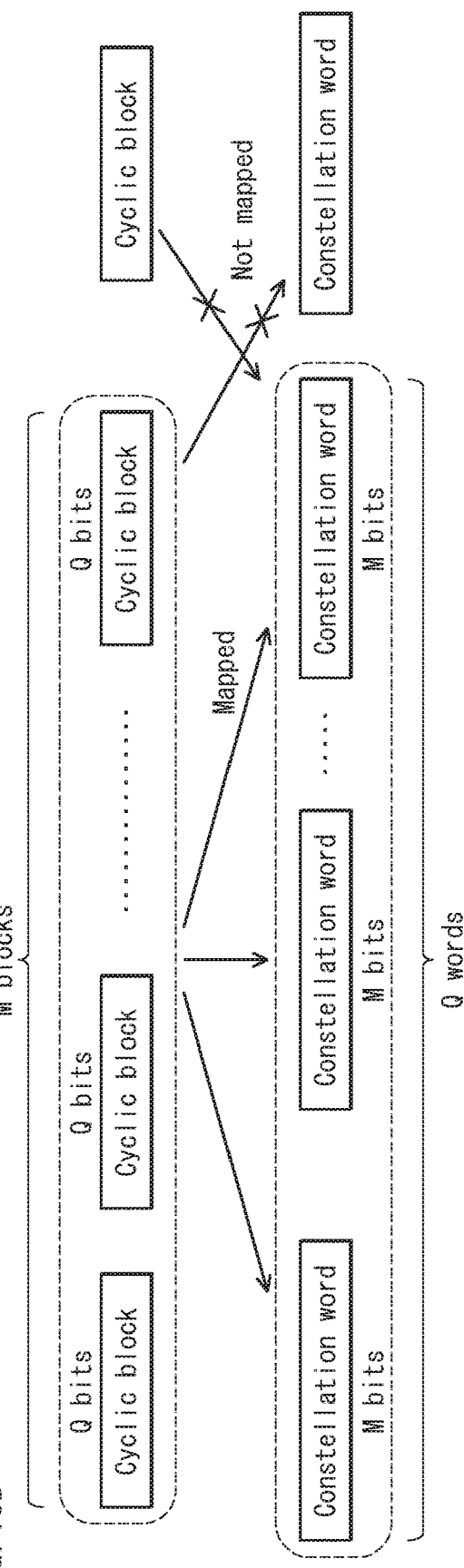

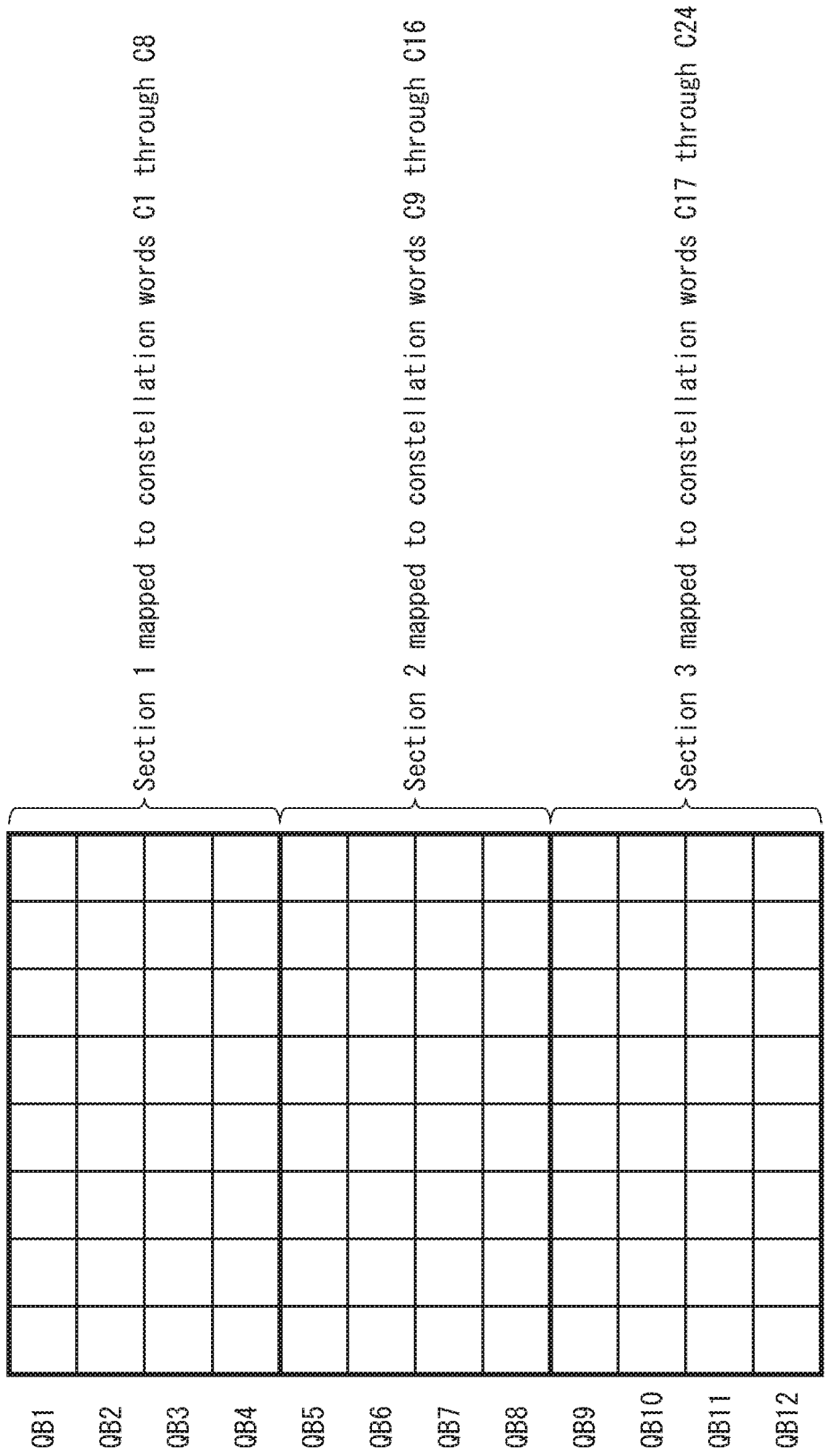

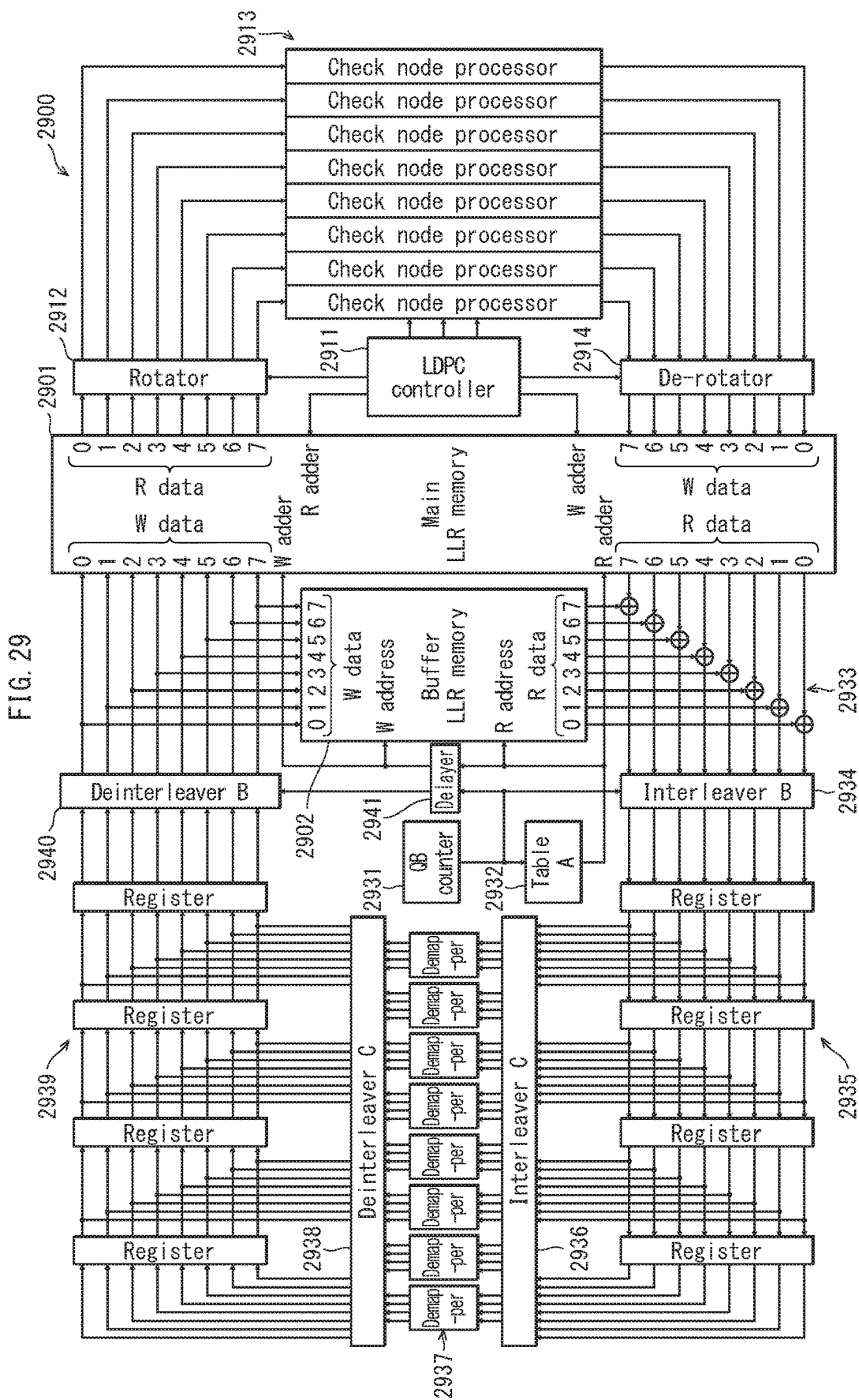

PARALLEL BIT INTERLEAVER

TECHNICAL FIELD

The present disclosure relates to the field of digital communications, and more specifically to a bit interleaver for a bit-interleaved coding and modulation system with quasi-cyclic low-density parity-check codes.

BACKGROUND ART

In recent years, bit-interleaved coding and modulation (hereinafter, BICM) systems have been used in the field of digital communications (see, for example, Non-Patent Literature 1).

BICM systems generally incorporate the following three steps.
(1) Encoding data blocks into codewords using, for example, quasi-cyclic low-density parity check (hereinafter, QC LDPC) code or similar.
(2) Performing bit interleaving on the bits of each codeword.
(3) Dividing each bit interleaved codeword into constellation words having a number of constellation bits, and mapping the constellation words to constellations.

CITATION LIST

Patent Literature

[Patent Literature 1]
ETSI EN 302 755 V1.2.1 (DVB-T2 Standards)

SUMMARY OF INVENTION

Technical Problem

Typically, efficiency is desirable in interleaving applied to the codewords of quasi-cyclic low-density parity-check codes.

The present disclosure aims to provide an interleaving method enabling efficient interleaving to be applied to the codewords of quasi-cyclic low-density parity-check codes.

Solution to Problem

In order to achieve the above-stated aim, a bit interleaving method for a communication system using quasi-cyclic low-density parity check codes, comprising: a reception step of receiving a codeword of the quasi-cyclic low-density parity check codes made up of N cyclic blocks each including Q bits; a bit permutation step of applying a bit permutation process to the codeword so as to permute the bits in the codeword; and a division step of dividing the codeword, after the bit permutation process, into a plurality of constellation words, each of the constellation words being made up of M bits and indicating one of $2^M$ predetermined constellation points, wherein prior to the bit permutation process, the codeword is divided into N/M sections, each of the sections including M of the cyclic blocks, and each of the constellation words being associated with one of the N/M sections, and in the bit permutation step, the bit permutation process is applied such that the M bits in each of the constellation words include one bit from each of M different cyclic blocks in a given section associated with a given constellation word, and such that all bits of the given section are mapped to only Q of the constellation words associated with the given section.

Advantageous Effects of Invention

The bit interleaving method of the present invention enables effective interleaving to be applied to the codewords of the quasi-cyclic low-density parity-check codes.

BRIEF DESCRIPTION OF DRAWINGS

FIG. 16 illustrates a problem occurring for 16K codes with an eight-column DVB-T2 bit interleaver when column twisting is applied.

FIG. 17 illustrates a problem occurring for 16K codes with a twelve-column DVB-T2 bit interleaver when column twisting is applied.

FIGS. 18A and 18B respectively illustrate a first and second condition discovered by the inventors enabling an extremely effective interleaver to be provided.

FIG. 19 illustrates a mapping function by an interleaver pertaining to an Embodiment.

FIG. 29 is a block diagram showing the configuration of an iterative BICM decoder pertaining to a further Embodiment.

DESCRIPTION OF EMBODIMENTS

Background Information

Figure 1:
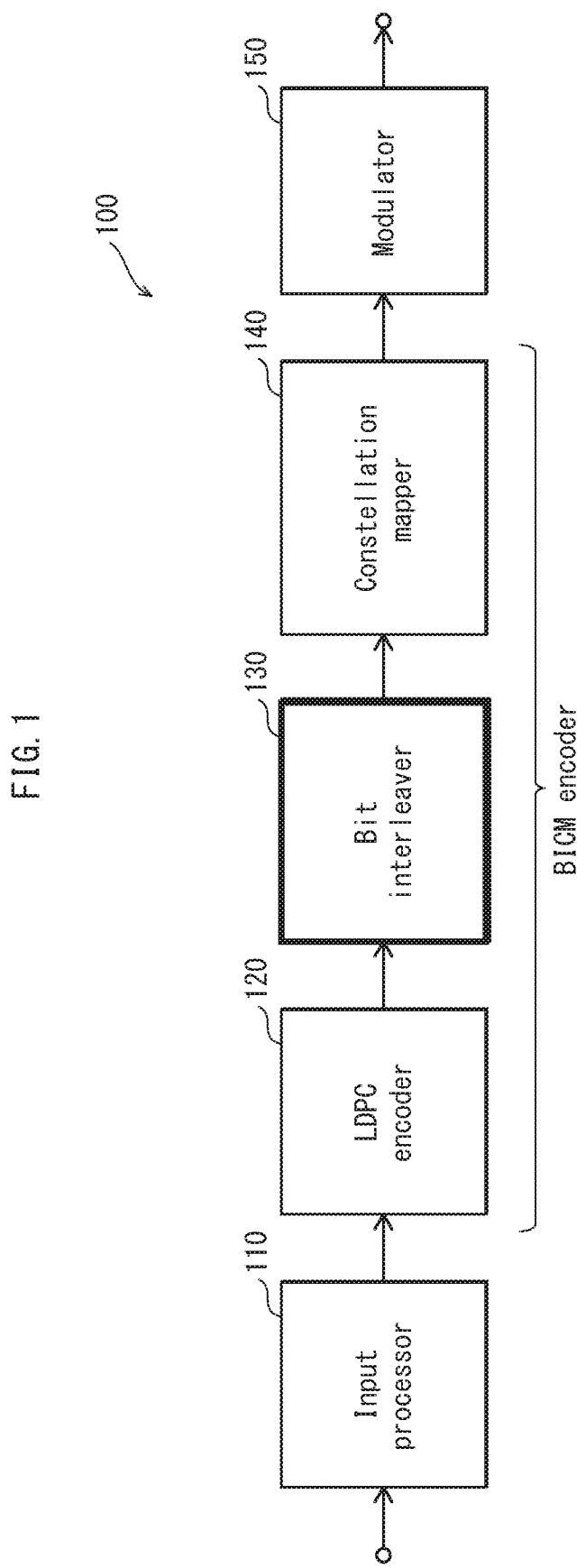
FIG. 1 is a block diagram showing the configuration of a transmitter that includes a typical BICM encoder.

FIG. 1 is a block diagram showing the configuration of a transmitter 100 that includes a typical bit-interleaved coding and modulation (hereinafter, BICM) encoder. As shown, the transmitter 100 includes an input processor 110, a BICM encoder (in turn including a low-density parity check (hereinafter, LDPC) encoder 120, a bit interleaver 130, and a constellation mapper 140), and a modulator 150.

The input processor 110 converts an input bitstream into blocks of a predetermined length. The LDPC encoder 120 encodes the blocks into codewords using LDPC codes, and then transmits the codewords to the bit interleaver 130. The bit interleaver 130 applies an interleaving process to each LDPC codeword, then divides each interleaved codeword into a sequence of cell words (i.e., constellation words). The constellation mapper 140 maps each cell word (i.e., constellation word) to a sequence of constellations (e.g., using QAM). The generic modulator 150 at the output includes all processing blocks from the output of the BICM encoder to a radio frequency (hereinafter, RF) power amplifier.

An LDPC code is a linear error correcting code that is fully defined by a parity-check matrix (hereinafter, PCM). A PCM is a binary sparse matrix that represents the connection of codeword bits (hereinafter also termed variable nodes) to the parity checks (hereinafter also termed check nodes). The columns and the rows of the PCM respectively correspond to the variable nodes and the check nodes. In the PCM, a connection between a variable node and a check node is represented by a one-element.

Quasi-cyclic low-density parity check (hereinafter, QC LDPC) codes are one variety of LDPC codes. QC LDPC codes have a structure that is particularly suited to hardware implementation. In fact, most standards in use today employ QC LDPC codes. The PCM of a QC LDPC code has a special configuration made up of a plurality of circulant matrices. A circulant matrix is a square matrix in which each row is a cyclic shift of the elements in the previous row, and has one, two, or more folded diagonals. Each circulant matrix has a size of Q×Q. Here, Q represents the cyclic factor of the QC LDPC. The above-described quasi-cyclic configuration allows Q check nodes to be processed in parallel, which is clearly beneficial for efficient hardware implementation.

Figure 2:
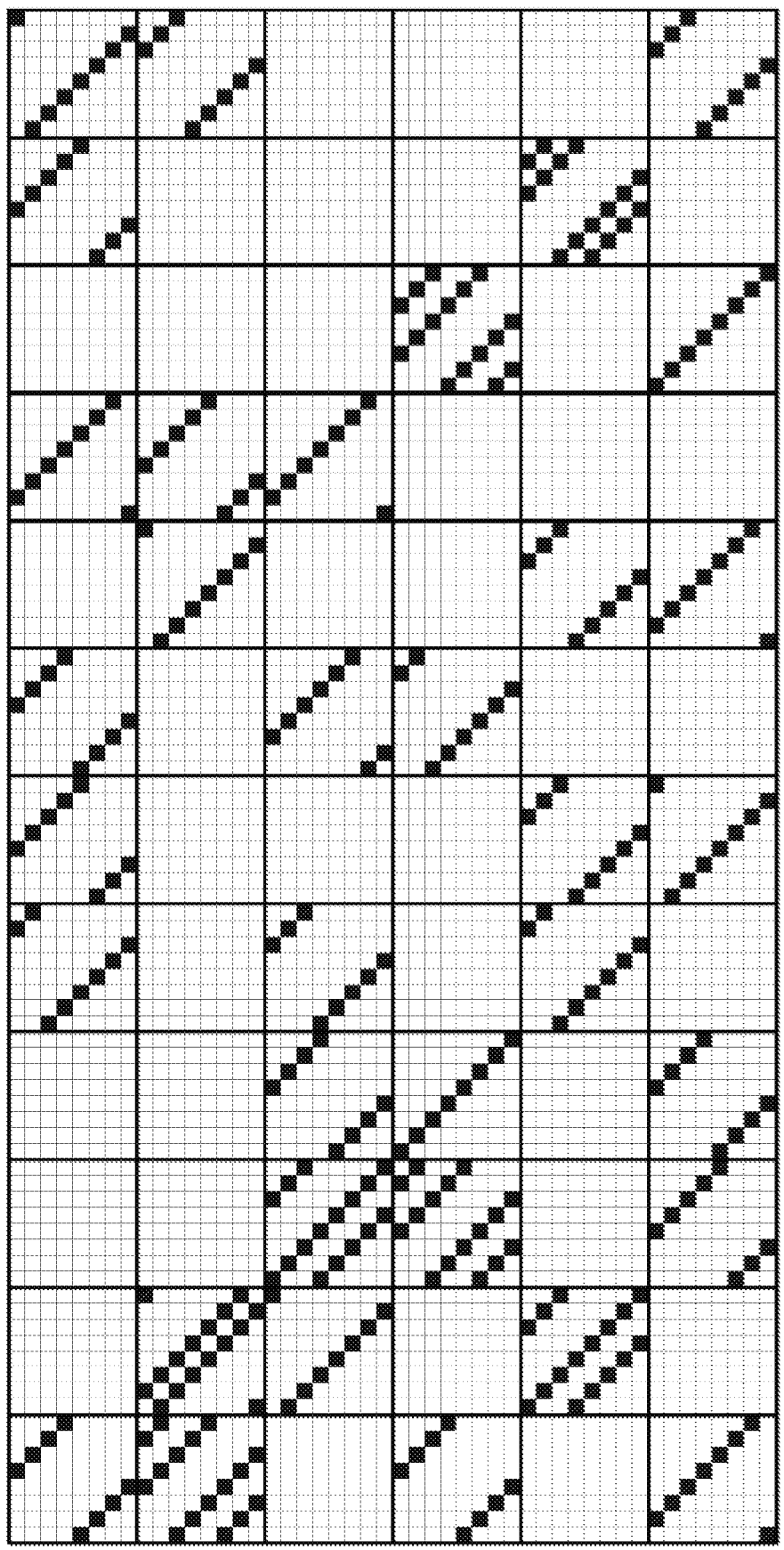
FIG. 2 illustrates an example of a parity-check matrix for quasi-cyclic low-density parity check codes having a coding rate of ½.

FIG. 2 shows the PCM of a QC LDPC code having a cyclic factor Q of eight, as an example. In FIG. 2, as well as in later-described FIGS. 3 and 5, the smallest squares each represent one element of the PCM, where the black squares are one-elements and all other squares are zero-elements. The PCM shown has circulant matrices with one or two folded diagonals apiece. This QC LDPC code encodes a block of 8×6=48 bits into a codeword of 8×12=96 bits. Accordingly, the coding rate of the QC LDPC is 48/96=1/2. The codeword bits are divided into a plurality of blocks of Q bits each. The Q bit blocks are hereinafter termed cyclic blocks (or cyclic groups) for this relation to the cyclic factor of Q.

Figure 3:
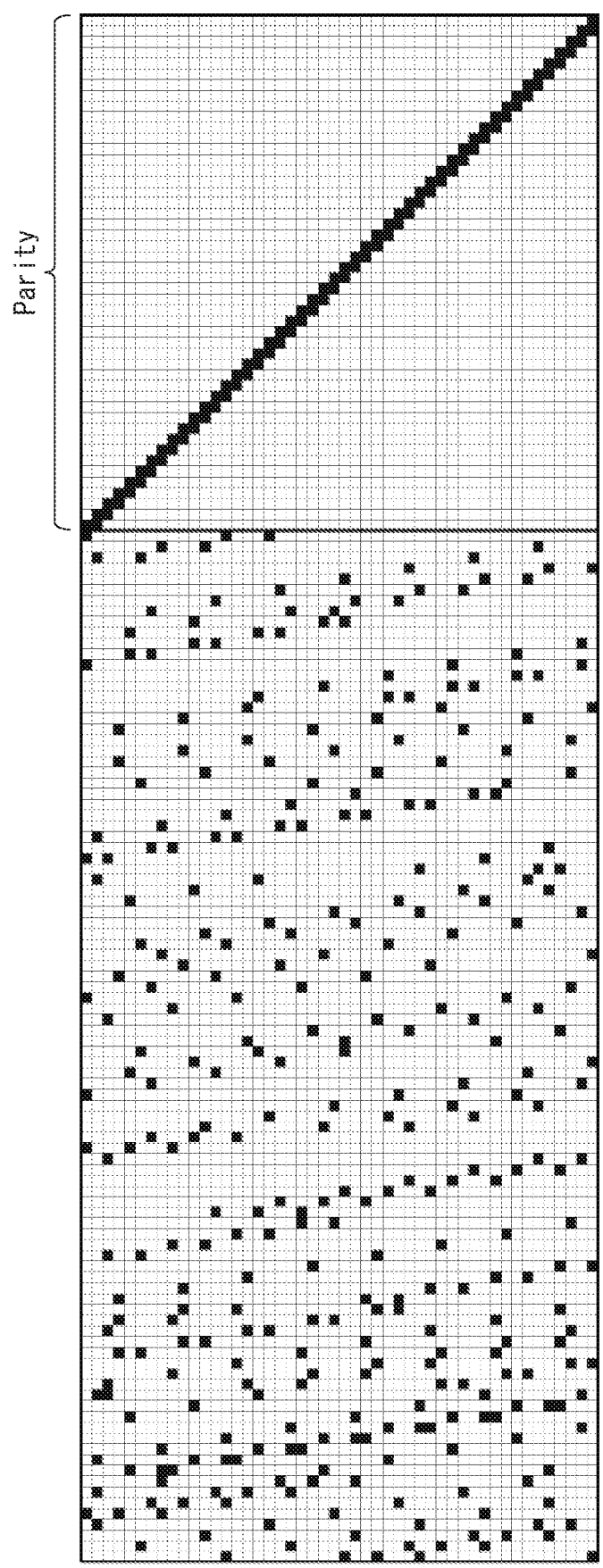
FIG. 3 illustrates an example of a parity-check matrix for repeat-accumulate quasi-cyclic low-density parity check codes having a coding rate of ⅔.

A special variety of QC LDPC codes are repeat-accumulate quasi-cyclic low-density parity check (hereinafter, RA QC LDPC) codes. RA QC LDPC codes are well known as being easy to encode, and are therefore used in a wide variety of standards (e.g., in second-generation DVB standards, including DVB-S2, DVB-T2, and DVB-C2). The right-hand side of the PCM corresponds to the parity bits. The one-elements therein are arranged in a staircase structure. FIG. 3 shows an example of a PCM for a RA QC LDPC having a coding rate of 2/3.

Above, and throughout, DVB-T is an abbreviation of Digital Video Broadcasting—Terrestrial, DVB-S2 is an abbreviation of Digital Video Broadcasting—Second Generation Satellite, DVB-T2 is an abbreviation of Digital Video Broadcasting—Second Generation Terrestrial, and DVB-C2 is an abbreviation of Digital Video Broadcasting—Second Generation Cable.

Figure 4:
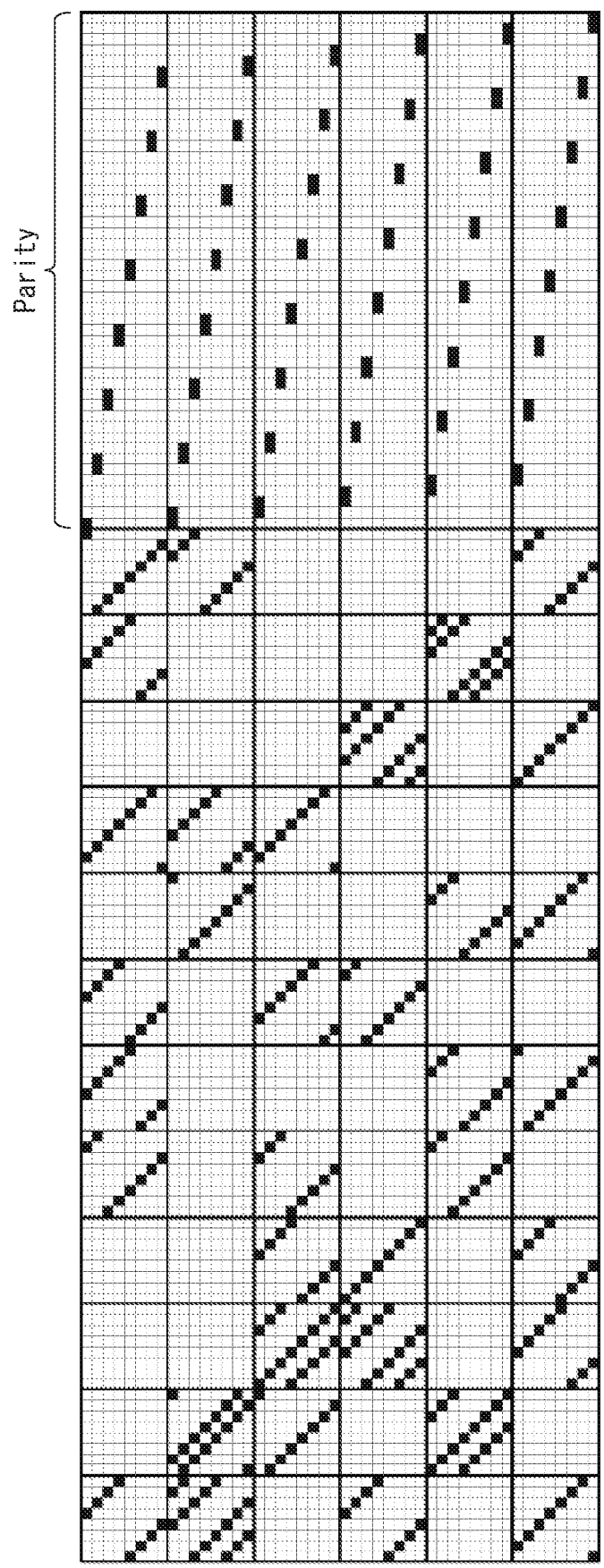
FIG. 4 illustrates a parity-check matrix for the repeat-accumulate quasi-cyclic low-density parity check codes of FIG. 3 after a row permutation.

By applying a simple row permutation to the PCM shown in FIG. 3, the quasi-cyclic structure of the RA QC LDPC codes is revealed, with the exception of the parity portion, shown in FIG. 4. The row permutation is a simple change of the graphical representation having no influence on the code definition.

Figure 5:
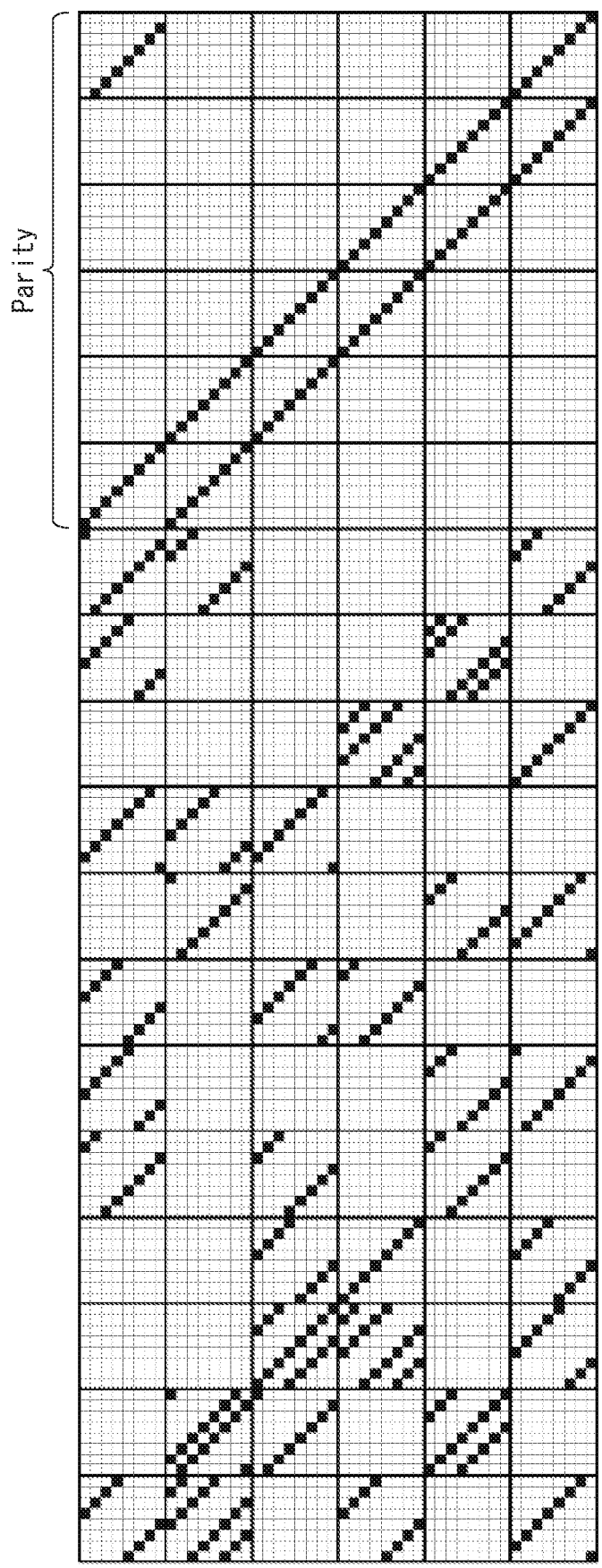
FIG. 5 illustrates a parity-check matrix for the repeat-accumulate quasi-cyclic low-density parity check codes of FIG. 3 after a row permutation and a parity permutation.

The quasi-cyclic structure of the PCM parity portion is imparted by applying a suitable row permutation to only the parity bits of the PCM shown in FIG. 4. This technique is widely known in the field and is used in standards such as DVB-T2, under the name of parity interleaving or of parity permutation. FIG. 5 shows the PCM obtained as a result of applying such parity permutation to the PCM shown in FIG. 4.

Typically, the bits of an LDPC codeword vary in importance, and the bits of a constellation vary in robustness level. Mapping the bits of an LDPC codeword to a constellation directly, i.e., without interleaving, leads to suboptimal performance. Thus, the bits of the LDPC codeword require interleaving prior to mapping onto constellations.

For this purpose, the bit interleaver 130 is provided between the LDPC encoder 120 and the constellation mapper 140, as shown in FIG. 1. By carefully designing the bit interleaver 130, the association between the bits of the LDPC codeword and the bits encoded by the constellation is improved, leading to improved receiver performance. Performance is typically measured using the bit-error rate (hereinafter, BER) as a function of the signal-to-noise ratio (hereinafter, SNR).

The bits of the LDPC codeword differ in importance primarily because not all bits are necessarily involved in the same number of parity checks. The more parity checks (check nodes) a given codeword bit (variable node) is involved in, the more important the given codeword bit is in an iterative LDPC decoding process. A further reason is that the variable nodes each have different connectivity to the cycles of a Tanner graph representing the LDPC codes. Therefore, the codeword bits are likely to differ in importance despite being involved in the same number of parity checks. These ideas are well understood in the field. As a rule, the importance of the variable nodes increases as the number of check nodes connected therewith increases.

In the particular case of QC LDPC codes, all bits included in a cyclic block of Q bits have the same number of parity checks applied thereto, and have the same connectivity to the cycles of the Tanner graph. Thus, all bits have the same importance.

Figure 6:
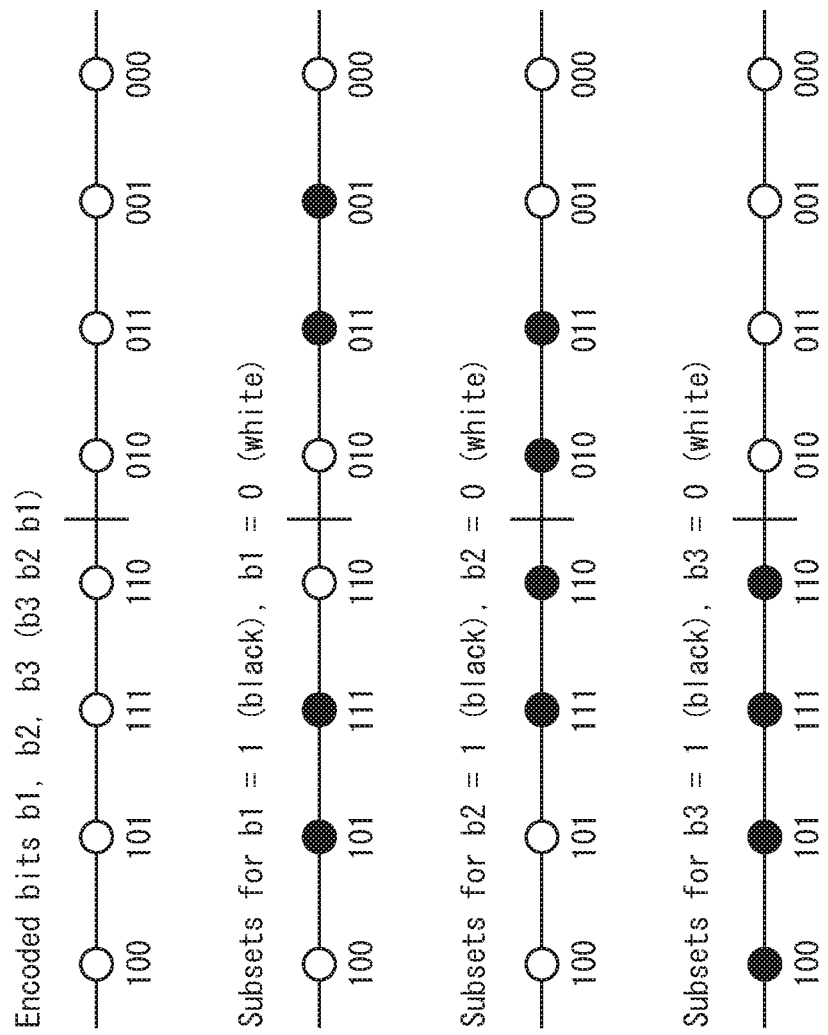
FIG. 6 describes different robustness levels of the bits encoded in eight PAM symbols.

Similarly, the encoded bits of a constellation are widely known to have different levels of robustness. For example, a quadrature amplitude modulation (hereinafter, QAM) constellation is made up of two independent pulse amplitude modulation (hereinafter, PAM) symbols, one symbol corresponding to the real part and the other symbol corresponding to the imaginary part. The two PAM symbols each encode M bits. FIG. 6 shows 8-PAM symbols using Gray encoding. As shown, the bits encoded by in each PAM symbol vary in terms of level of robustness. The difference in robustness is a result of the distance between two subsets defined by each bit (e.g., 0 or 1) being different for each of the bits. The greater the distance, the more robust and reliable the bit. FIG. 6 indicates that bit b3 has the highest robustness level, while bit b1 has the lowest robustness level.

Thus, a 16-QAM constellation encodes four bits and has two robustness levels. Likewise, a 64-QAM constellation encodes six bits and has three robustness levels. Also, a 256-QAM constellation encodes eight bits and has four robustness levels.

The following parameters are hereinafter used throughout the present description.

Cyclic factor: $Q=8$
Number of cyclic blocks per LDPC codeword: $N=12$
Number of bits per constellation: $M=4$ (i.e., 16-QAM)

Given the above parameters, the number of constellations to which each LDPC codeword is mapped is equal to $Q \times N/M=24$. Typically, the parameters Q and N are selected such that $Q \times N$ is equal to a multiple of M for all constellations supported by the system.

Figure 7:
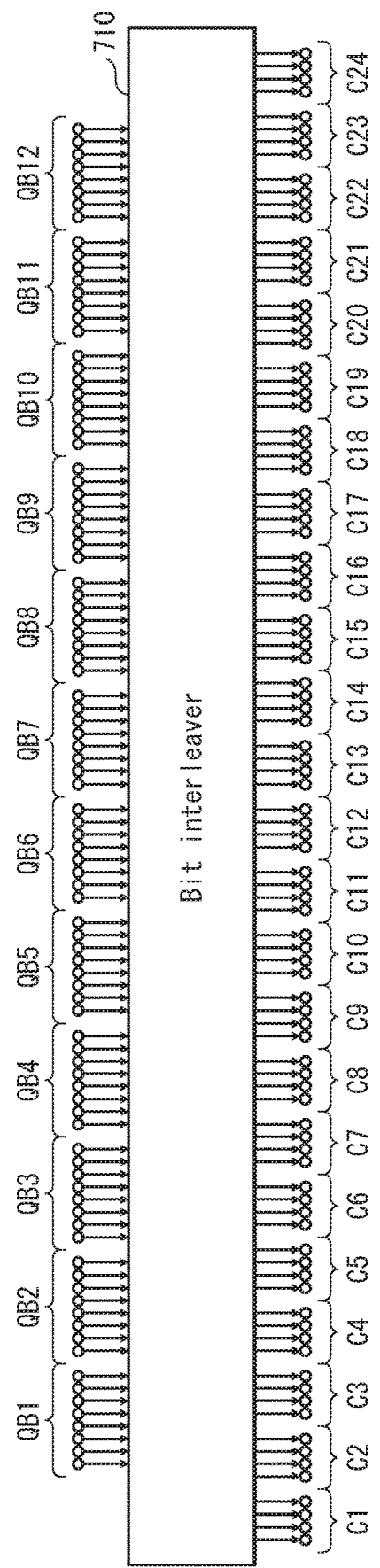
FIG. 7 is a block diagram showing the configuration of a typical bit interleaver where the cyclic factor Q is 8, the number of cyclic blocks per low-density parity check codeword N is 12, and the number of bits per constellation M is 4.

FIG. 7 is a block diagram showing the configuration of a typical interleaver when the above parameters are applied. In FIG. 7, the 12 cyclic blocks are labeled QB1, . . . , QB 12, and the 24 constellations are labeled C1, . . . , C24. A bit interleaver 710 interleaves the 96 bits of the LDPC codeword.

A conventional bit interleaver is known from the DVB-T2 standard (see ETSI EN 302 755). The DVB-T2 standard is a television standard presenting improvements over the DVB-T standard, and describes a second-generation baseline transmission system for digital television broadcasting. The DVB-T2 standard gives the details of a channel coding and modulation system for broadcast television services and generic data.

Figure 8A:
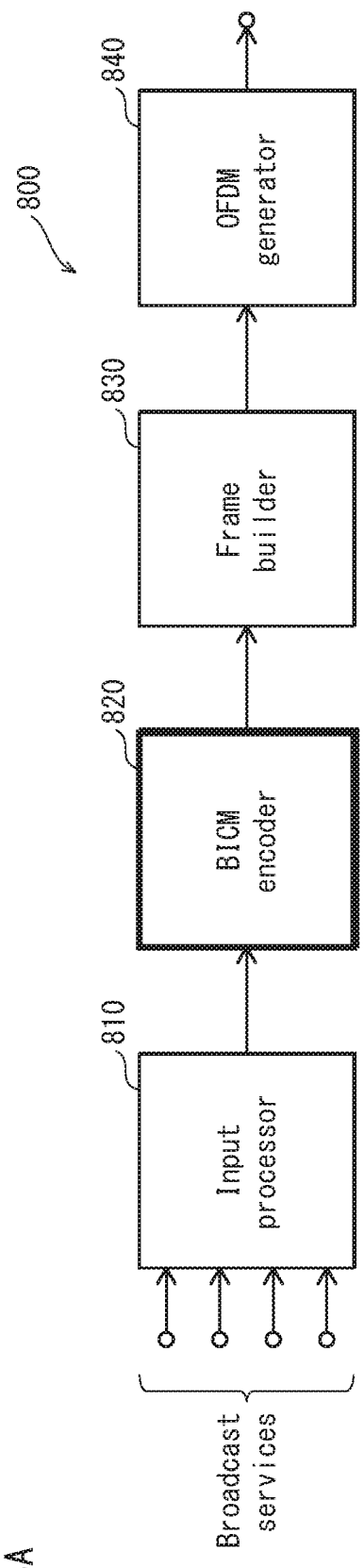
FIG. 8A is a block diagram showing the configuration of a DVB-T2 modulator used in the DVB-T2 standard.

FIG. 8A is a block diagram showing the structure of a modulator used in the DVB-T2 standard (i.e., a DVB-T2 modulator). The DVB-T2 modulator 800 includes an input processor 810, a BICM encoder 820, a frame builder 830, and an OFDM generator 840.

The input processor 810 converts an input bitstream into blocks of a predetermined length. The BICM encoder 820 applies BICM processing to the input. The frame builder 830 uses input from the BICM encoder 820 and the like to generate a distribution frame structure in the DVB-T2 format. The OFDM generator 840 performs pilot addition, fast Fourier transform application, guard interval insertion, and the like on the distribution frame structure, then outputs a transmission signal in the DVB-T2 format.

The BICM used in the DVB-T2 standard is described in chapter 6 of the ETSI EN 302 755 standard. The aforementioned standard is incorporated herein by reference and explained below.

Figure 8B:
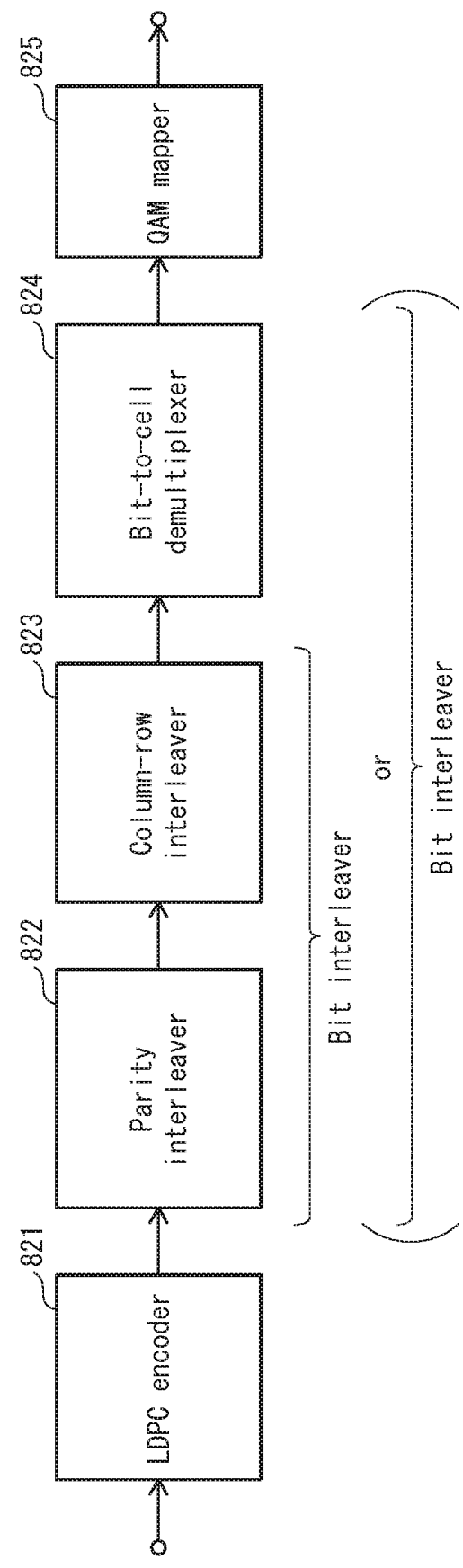
FIG. 8B is a block diagram showing the configuration of a BICM encoder for the DVB-T2 modulator of FIG. 8A.

FIG. 8B is a block diagram showing the structure of the BICM encoder 820 in the DVB-T2 modulator 800 illustrated in FIG. 8A. FIG. 8B omits outer BCH encoding, constellation rotation, the cell interleaver, the time interleaver, and the like.

The BICM encoder 820 includes an LDPC encoder 821, a bit interleaver (in turn including a parity interleaver 822 and a column-row interleaver 823), a bit-to-cell demultiplexer 824, and a QAM mapper 825.

The LDPC encoder 821 encodes the blocks into codewords using LDPC codes. The bit interleaver (which includes the parity interleaver 822 and the column-row interleaver 823) performs interleaving on the bits of the codewords. The bit-to-cell demultiplexer 824 demultiplexes the interleaved bits of the codewords into cell words (constellation words). The QAM mapper 825 maps the cell words (constellation words) to complex QAM symbols. The complex QAM symbols are also termed cells. In fact, the bit-to-cell demultiplexer 824 may also be considered a part of the bit interleaver. In such situations, the BICM encoder conforming to the DVB-T2 standard may be considered to have the basic structure shown in FIG. 1.

The LDPC codes used in the DVB-T2 standard are RA QC LDPC codes having a cyclic factor of $Q=360$. Two codeword lengths are defined for the DVB-T2 standard, one being 16200 bits and the other being 64800 bits. In the present document, LDPC codes using a codeword length of 16200 bits are referred to as 16K codes (or as 16K LDPC codes), and LDPC codes having a codeword length of 64800 bits are referred to as 64K codes (or as 64K LDPC codes). The number of cyclic blocks per codeword is 45 for the 16K codes and 180 for the 64K codes. The available codes corresponding to each block length (codeword length) are given in Tables A1 through A6 of ETSI EN 302 755 for the DVB-T2 standard.

The bit interleaver is used only for constellations larger than quadrature phase-shift keying constellations (hereinafter, QPSK), and includes the parity interleaver 822, the column-row interleaver 823, and the bit-to-cell demultiplexer 824. According to the DVB-T2 standard, the bit interleaver does not include the bit-to-cell demultiplexer 824. However, the present document pertains to interleaving as applied to LDPC codes prior to constellation mapping. As such, the bit-to-cell demultiplexer 824 is treated as a part of the bit interleaver.

The parity interleaver 822 performs parity permutation on the parity bits of each codeword so as to clarify the quasi-cyclic structure thereof, as described above (see FIGS. 4 and 5).

Conceptually, the column-row interleaver 823 operates by writing the bits of each LDPC codeword column-wise in an interleaver matrix, then reading the bits row-wise. The first bit of the LDPC codeword is written first, and is read first. After writing and before reading the LDPC codeword bits, the column-row interleaver 823 cyclically shifts the columns of bits by a predetermined number of positions. This is termed column twisting in the DVB-T2 standard. The number of columns Nc and the number of rows Nr in the interleaver matrix are given in Table 1 for several constellation sizes, according to the two aforementioned LDPC codeword lengths.

TABLE 1

| LDPC codeword length | Constellation size | No. of columns: Nc | No. of rows: Nr |
|---|---|---|---|
| 16200 | 16-QAM | 8 | 2025 |
|  | 64-QAM | 12 | 1350 |
|  | 256-QAM | 8 | 2025 |
| 64800 | 16-QAM | 8 | 8100 |
|  | 64-QAM | 12 | 5400 |
|  | 256-QAM | 16 | 4050 |

The number of columns Nc is twice the number of bits per constellation, with the exception of 16K codes with a 256-QAM constellation. This exception occurs because the LDPC codeword length of 16200 is not a multiple of 16, i.e., is not twice the number of bits per 256-QAM constellation.

Figure 9B:
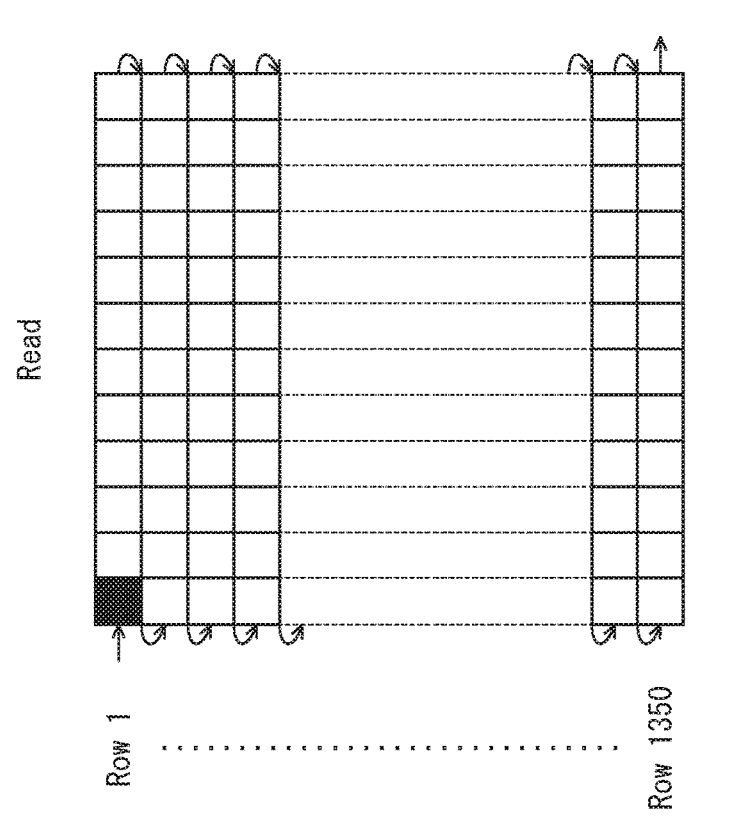
FIG. 9B illustrates a read process for the bits of the codeword written in the manner indicated by FIG. 9A as performed by the column-row interleaver.
Figure 9A:
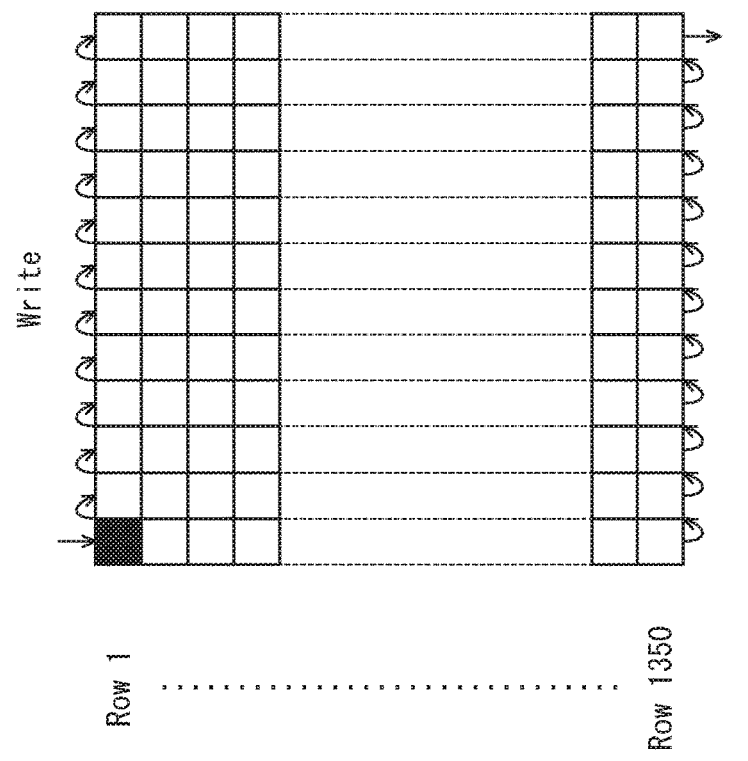
FIG. 9A illustrates a write process for the bits of a 16K codeword (i.e., an LDPC code where the LDPC codeword length is 16200 bits) as performed by a column-row interleaver having twelve columns.
Figure 10B:
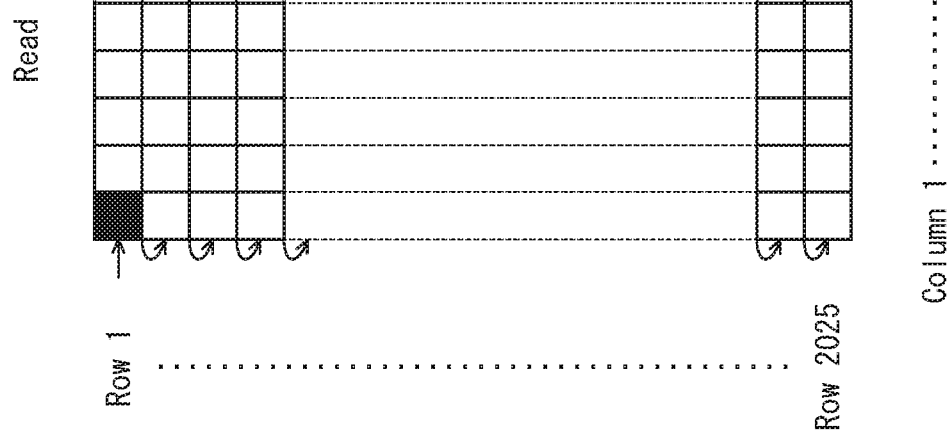
FIG. 10B illustrates a read process for the bits of the codeword written in the manner indicated by FIG. 10A as performed by the column-row interleaver.
Figure 10A:
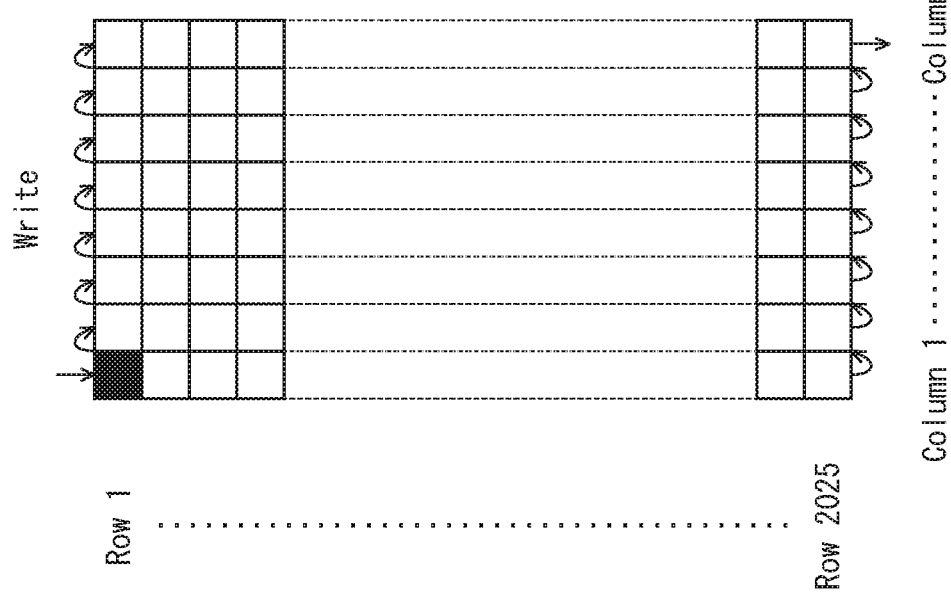
FIG. 10A illustrates a write process for the bits of a 16K codeword as performed by a column-row interleaver having eight columns.

The codeword bit writing process and bit reading process for 16K codes performed by the column-row interleaver 823 is illustrated in FIGS. 9A and 9B for twelve columns, and in FIGS. 10A and 10B for eight columns. Each of the small squares corresponds to one bit of the LDPC codeword. The blackened square represents the first bit of the LDPC codeword. The arrows indicate the order in which the bits are written to and read from the interleaver matrix. For example, when the interleaver matrix has twelve columns, the codeword bits of the 16K code are written in the order given in FIG. 9A, namely (Row 1, Column 1), (Row 2, Column 1), . . . , (Row 1350, Column 1), (Row 1, Column 2), . . . , (Row 1350, Column 12), then read in the order given in FIG. 9B, namely (Row 1, Column 1), (Row 1, Column 2), . . . , (Row 1, Column 12), (Row 2, Column 1), . . . , (Row 1350, Column 12). FIGS. 9A, 9B, 10A, and 10B do not illustrate the column twisting process.

Prior to QAM mapping, the bit-to-cell demultiplexer 824 demultiplexes the LDPC codewords to obtain a plurality of parallel bit streams. The number of streams is twice the number of encoded bits M per QAM constellation, i.e., 2×M, with the exception of 16K LDPC codes with a 256-QAM constellation. For 16K LDPC codes with a 256-QAM constellation, the number of streams equal to the number of encoded bits M per QAM constellation. The M encoded bits per constellation are referred to as one cell word (constellation word). For the 16K LDPC codes, the number of cell words per codeword is 16200/M, as given below.

8100 cells for QPSK,
4050 cells for 16-QAM,
2700 cells for 64-QAM, and
2025 cells for 256-QAM.

Figure 12:
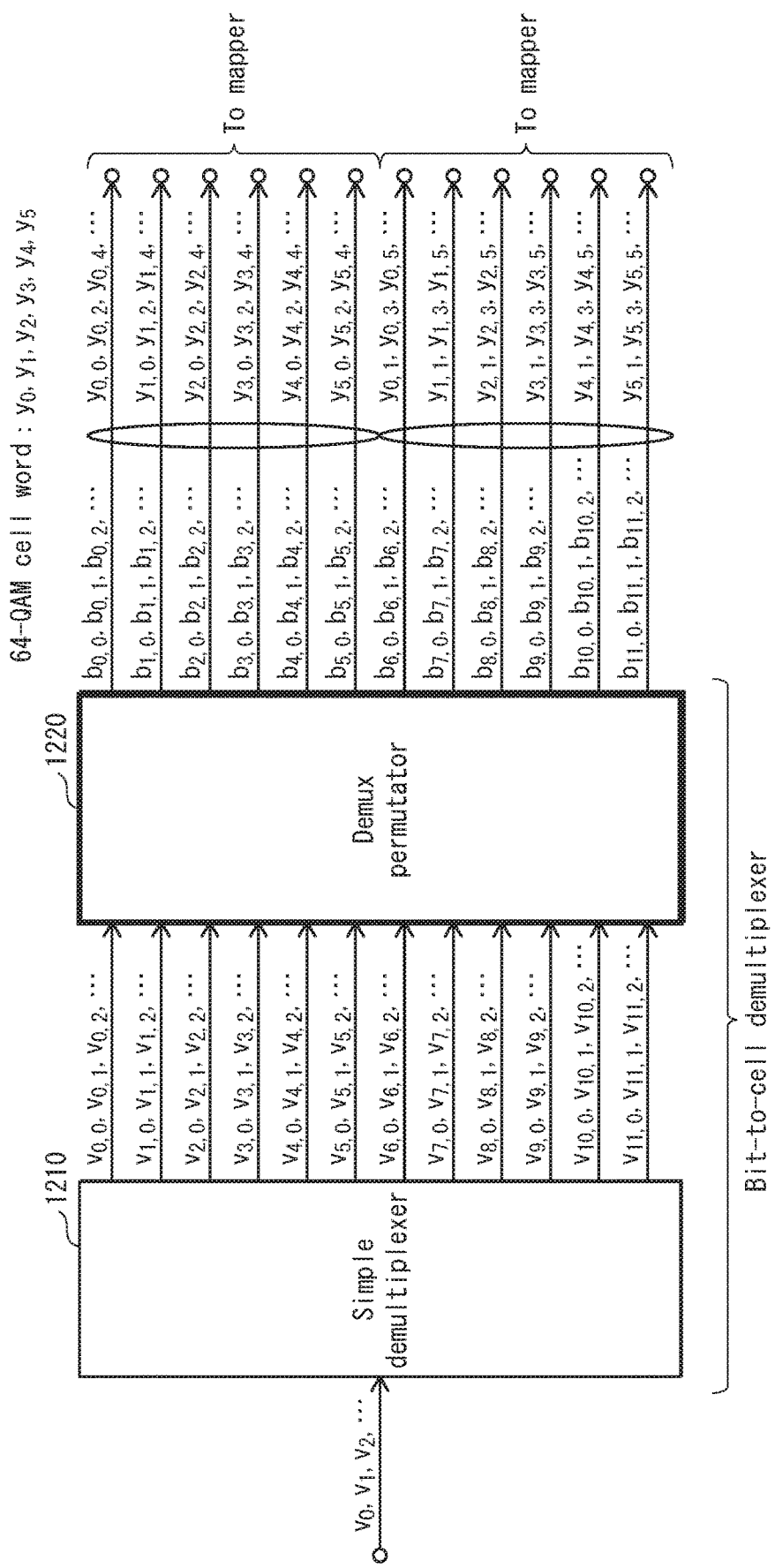
FIG. 12 is a block diagram showing the configuration of a bit-to-cell demultiplexer used for 16K codes of 64-QAM in the DVB-T2 standard.
Figure 13:
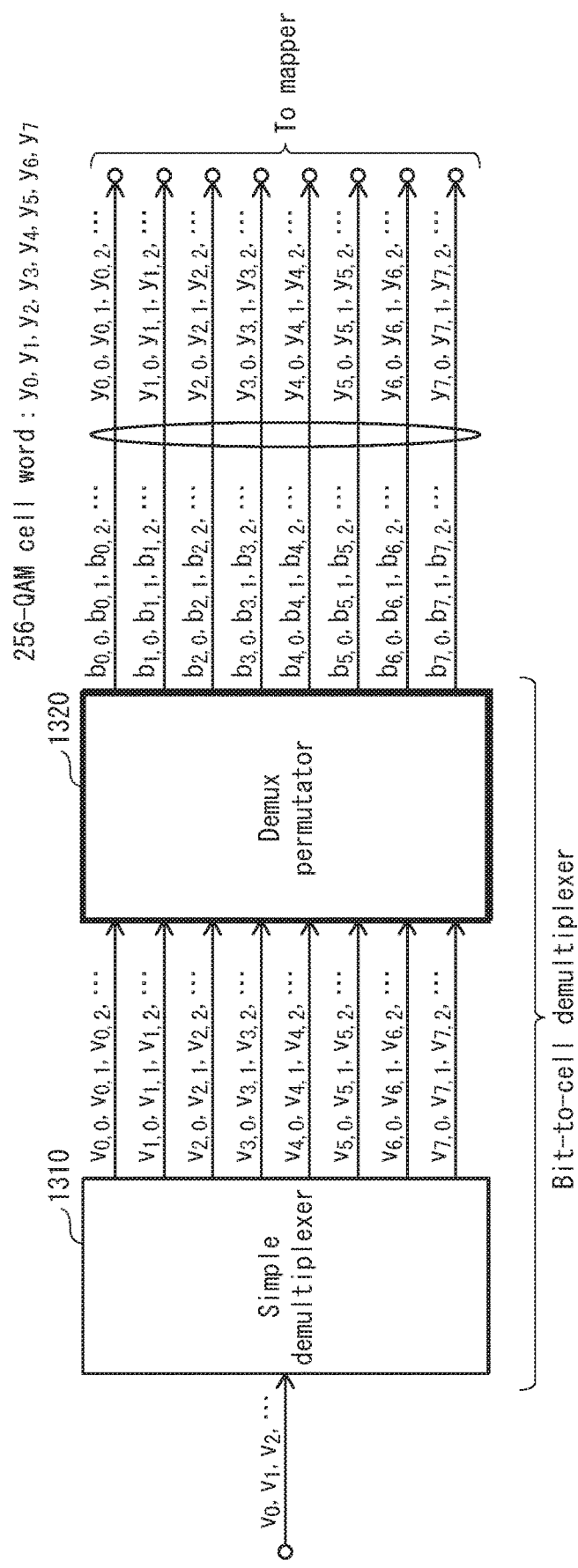
FIG. 13 is a block diagram showing the configuration of a bit-to-cell demultiplexer used for 16K codes of 256-QAM in the DVB-T2 standard.

According to Table 1, given above, the number of parallel streams is equal to the number of columns in the column-row interleaver for constellations larger than QPSK. The bit-to-cell demultiplexers corresponding to 16-QAM constellations, 64-QAM constellations, and 256-QAM constellations for 16K LDPC codes are respectively shown in FIGS. 11, 12, and 13. The bit notation used is that of the DVB-T2 standard.

Figure 11:
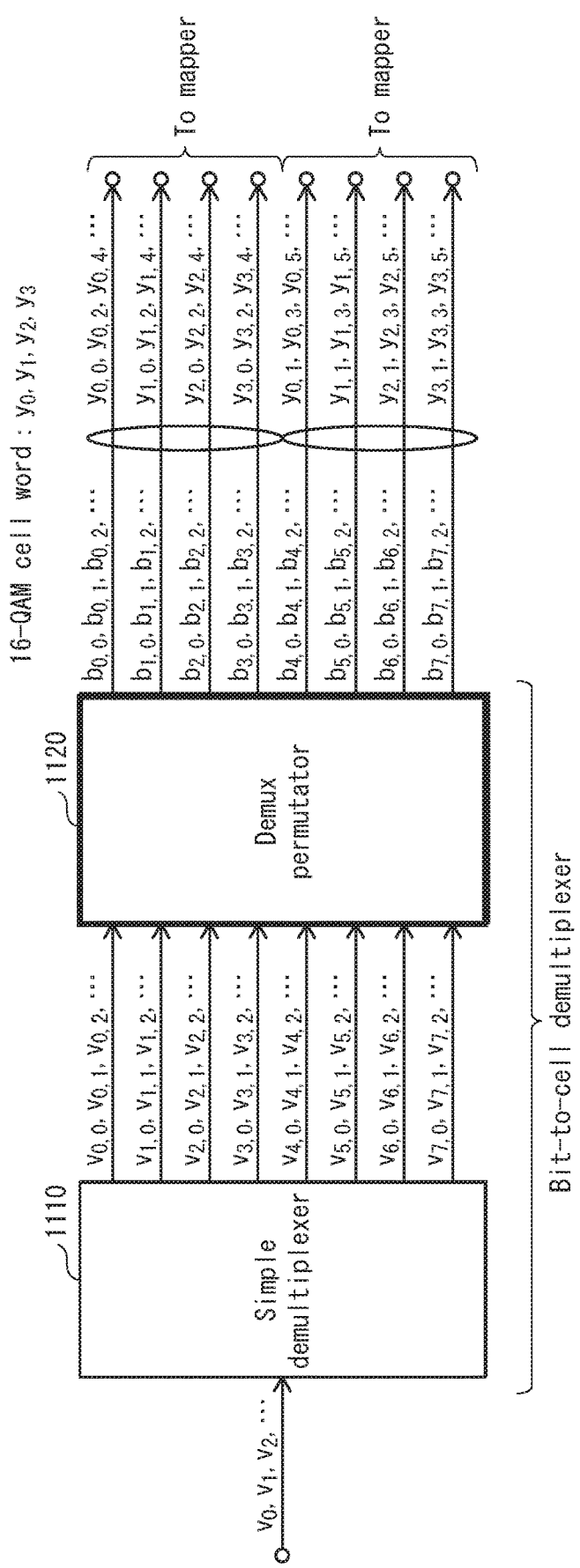
FIG. 11 is a block diagram showing the configuration of a bit-to-cell demultiplexer used for 16K codes of 16-QAM in the DVB-T2 standard.

As shown in FIG. 11 (and FIGS. 12 and 13), the bit-to-cell demultiplexer 824 includes a simple demultiplexer 1110 (also 1210, 1310) and a demux permutator 1120 (also 1220, 1320).

In addition to having the simple demultiplexer 1110 (1210, 1310) simply demultiplex the LDPC codewords, to which interleaving has been applied, the bit-to-cell demultiplexer 824 also has the demux permutator 1120 (1220, 1320) perform a permutation on the demultiplexed parallel bit streams.

However, when the column-row interleaver is used (i.e., for 16-QAM constellations or larger), the permutation applied to the bit streams is identical to a permutation applied to the columns of the column-row interleaver due to the number of parallel bit streams being equal to the number of columns. Therefore, the permutation performed by the bit-to-cell demultiplexer 824 is regarded as a part of the bit interleaver.

The bit interleaver used in the DVB-T2 standard essentially has two problems.

The first problem is that parallelism is impaired when the number of cyclic blocks in the LDPC codeword is not a multiple of the number of columns in the bit interleaver matrix. Reduced parallelism leads to increased latency. This is especially problematic when iterative BICM decoding is used by the receiver. This situation occurs for several combinations of LDPC codeword length and constellation size in the DVB-T2 standard.

Figure 14:
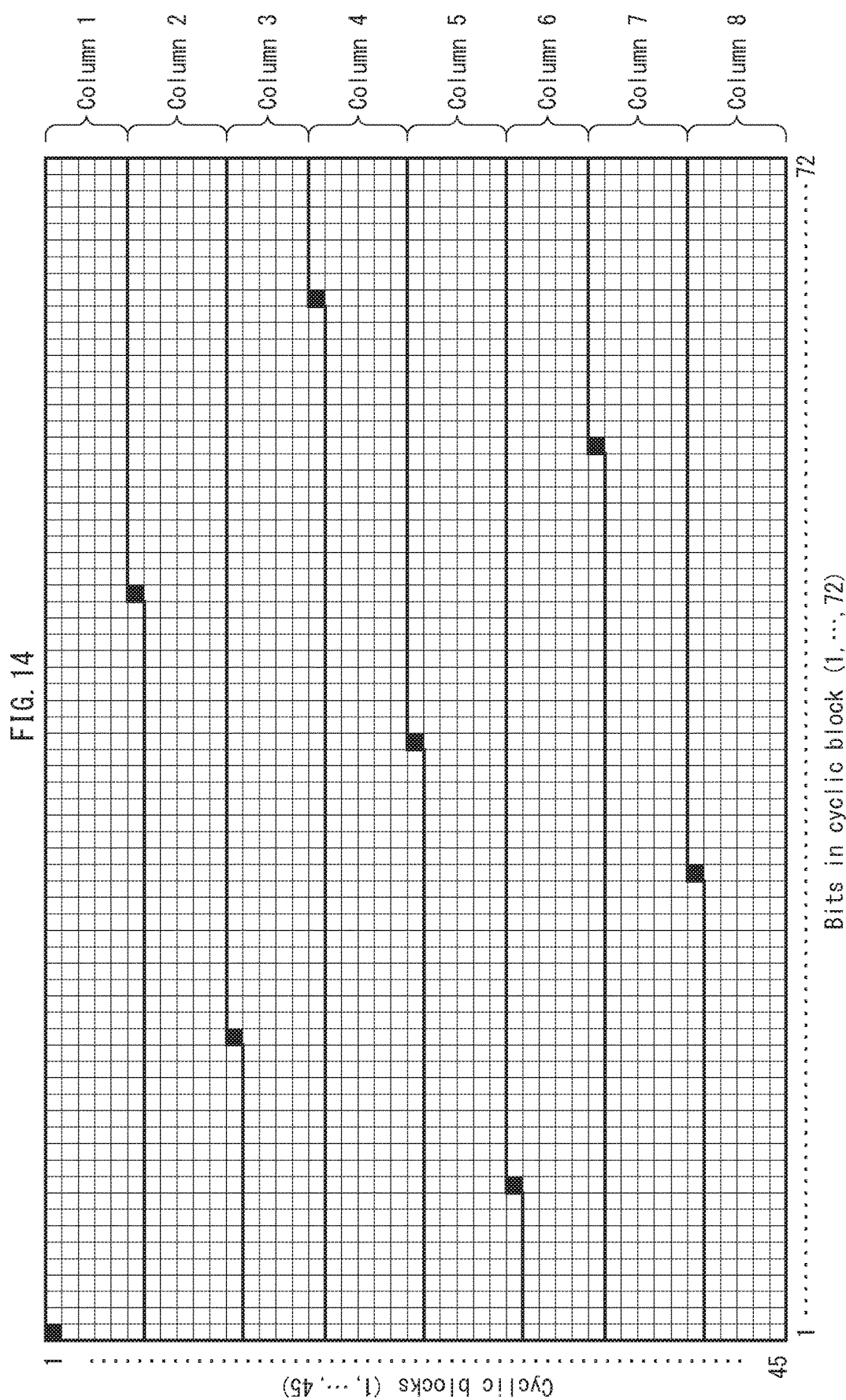
FIG. 14 illustrates a problem occurring for 16K codes with an eight-column DVB-T2 bit interleaver.
Figure 15:
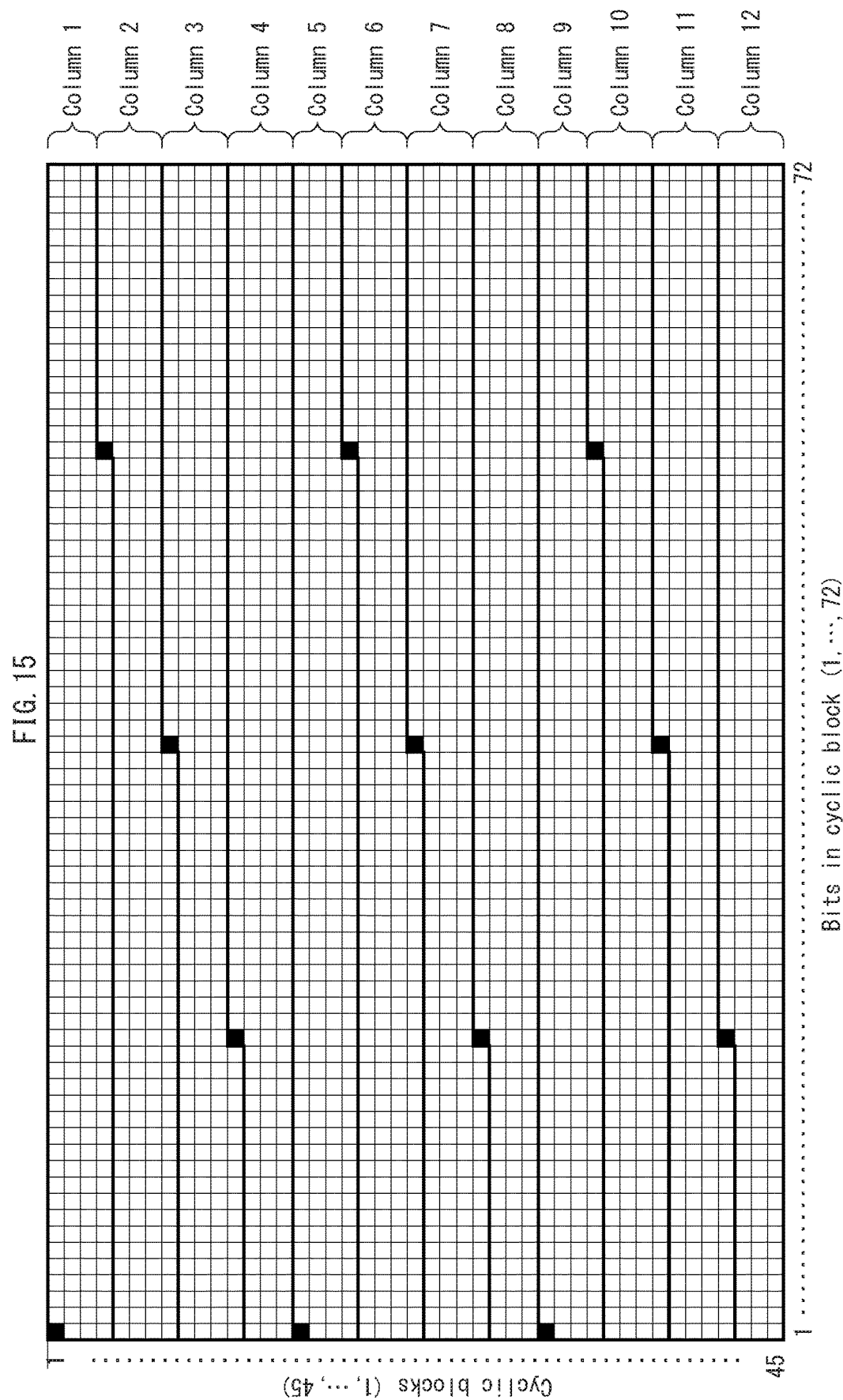
FIG. 15 illustrates a problem occurring for 16K codes with a twelve-column DVB-T2 bit interleaver.

FIGS. 14 and 15 illustrate the aforementioned situation for 16K LDPC code cases where the interleaver matrix has eight and twelve columns, respectively. Eight columns are used in the interleaver matrix for 16-QAM constellations and 256-QAM constellations. Twelve columns are used in the interleaver matrix for 64-QAM constellations. In FIGS. 14 and 15, the grid represents an LDPC codeword, the small squares each represent one bit of the LDPC codeword, the rows correspond to the cyclic blocks, and the columns correspond to bits of the same bit index within a cyclic block. The blackened squares represent eighth and twelfth bits of the first row in the interleaver matrix. For ease of comprehension, the number of bits per cyclic block has been reduced from 360 to 72. However, this does not affect the understanding.

The second problem is that, in the DVB-T2 standard, the number of possible bit interleaver configurations is limited by the number of columns in the bit interleaver matrix.

A further problem of the DVB-T2 bit interleaver is that the regularity and parallelism of the permutation is impaired by the column twisting process. FIGS. 16 and 17 respectively illustrate the same situations as FIGS. 14 and 15, with the addition of the column twisting process. When the interleaver matrix has eight columns for the 16K LDPC codes, the column twisting values for the columns of the DVB-T2 bit interleaver are (0, 0, 0, 1, 7, 20, 20, 21). Similarly, when the interleaver matrix has twelve columns for the 16K LDPC codes, the column twisting values for the columns of the DVB-T2 bit interleaver are (0, 0, 0, 2, 2, 2, 3, 3, 3, 6, 7, 7).

Accordingly, a bit interleaver that reduces latency while improving parallelism is desired. These properties are particularly important in iterative BICM decoding.

(Experimenter Discoveries)

The inventor has discovered, as the fruit of prolonged experimentation, that an interleaver satisfying the following two conditions is extremely efficient.

(Condition 1)

The M bits of each constellation are each mapped to one of M different cyclic blocks of the LDPC codeword. This is equivalent to mapping one bit from M different cyclic blocks of the LDPC codeword to a constellation word. This is schematically illustrated in FIG. 18A.

(Condition 2)

All constellation words mapped to the M cyclic blocks are mapped only to that particular cyclic block. This is equivalent to mapping all M×Q bits of the M different cyclic blocks each made up of Q bits to exactly Q constellations. This is schematically illustrated in FIG. 18B.

The above conditions imply that exactly Q constellations are mapped to each set of M cyclic blocks.

Embodiment 1

The following describes the details of a bit interleaver (i.e., a parallel bit interleaver) that satisfies conditions 1 and 2 given above. In the following description, processing and the units performing such processing are labeled with the same reference numbers wherever applicable.

In the present document, each group of M cyclic blocks and each group of Q constellation words is referred to as a section (or as an interleaver section).

Figure 20:
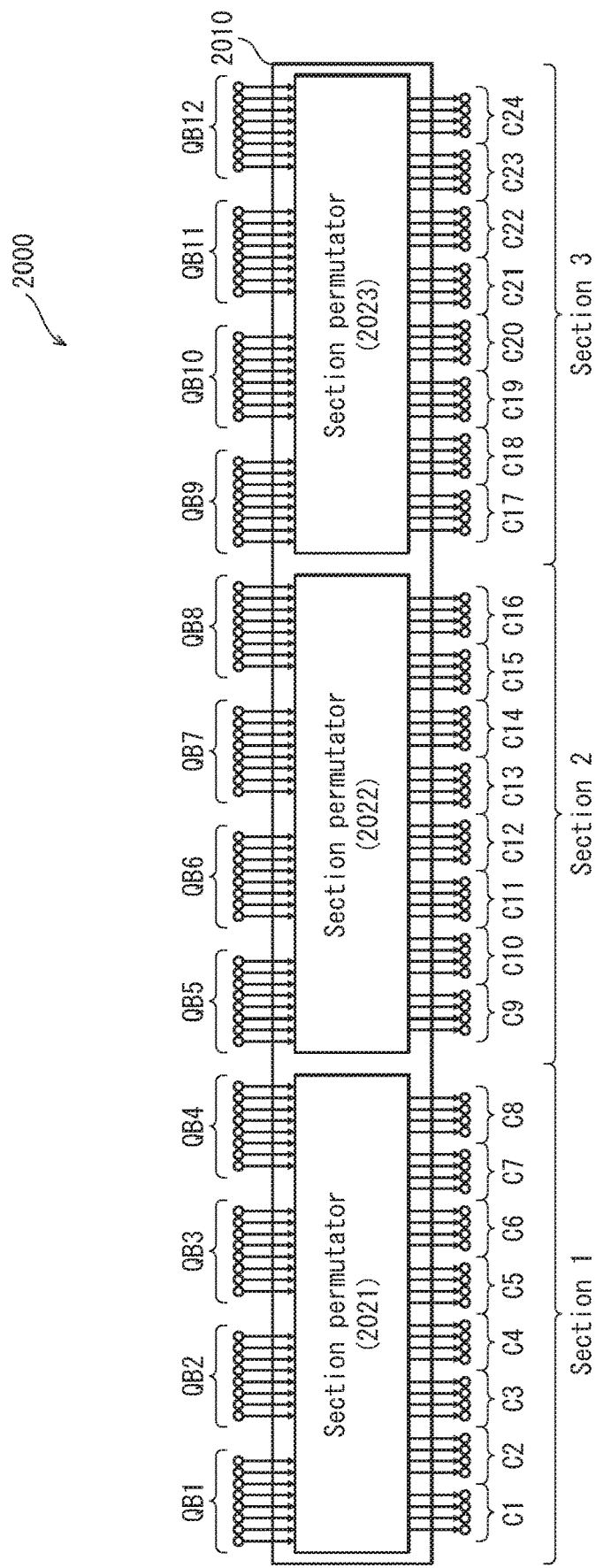
FIG. 20 is a block diagram showing the configuration of an interleaver pertaining to an Embodiment.

FIGS. 19 and 20 are block diagrams respectively illustrating the mapping function of a bit interleaver satisfying Conditions 1 and 2 and corresponding to the aforementioned parameters (i.e., Q=8, M=4, N=12), and a sample configuration for such a bit interleaver.

In FIGS. 19 and 20, the QC-LDPC codewords are made up of N=12 cyclic block, each in turn made up of Q=8 bits. Each of the 24 constellation words is made up of M=4 bits. Each constellation word indicates one of $2^M=16$ constellation points. The bit interleaver is divided into N/M=3 sections. The 24 constellation words are each associated one of the three sections.

A bit interleaver 2000 includes a bit permutator 2010, which in turn includes N/M (=3) section permutators 2021, 2022, and 2023, each operating independently. However, rather than providing three section permutators, a single section permutator may, for example, be provided so as to performs the three section permutation processes described below, switching therebetween over time.

The section permutators (2021, 2022, and 2023) each independently perform a section permutation on the 32 bits making up each of 4 cyclic blocks, such that one bit from every four cyclic blocks (i.e., QB1 through QB4, QB5 through QB8, and QB9 through QB12) is mapped to each group of eight constellation words (i.e., C1 through C8, C9 through C16, and C17 through C24).

Conditions 1 and 2, described above, ensure that the bit interleaver is divisible into N/M parallel sections. The section permutations applied to the parallel sections may all apply the same permutation rules, may each apply different permutation rules, or may involve a subset of the sections applying identical permutation rules while other differ.

For example, the section permutators may map the Q bits of a cyclic block (which each have the same importance in LDPC decoding) to bits having the same bit index (i.e., having the same robustness level) in the Q constellation words. For each cyclic block, the Q bits may be in sequential or in permutated order. The latter case is described with reference to FIGS. 21A and 21B, while the former case is described with reference to FIGS. 22A and 22B.

Figure 21B:
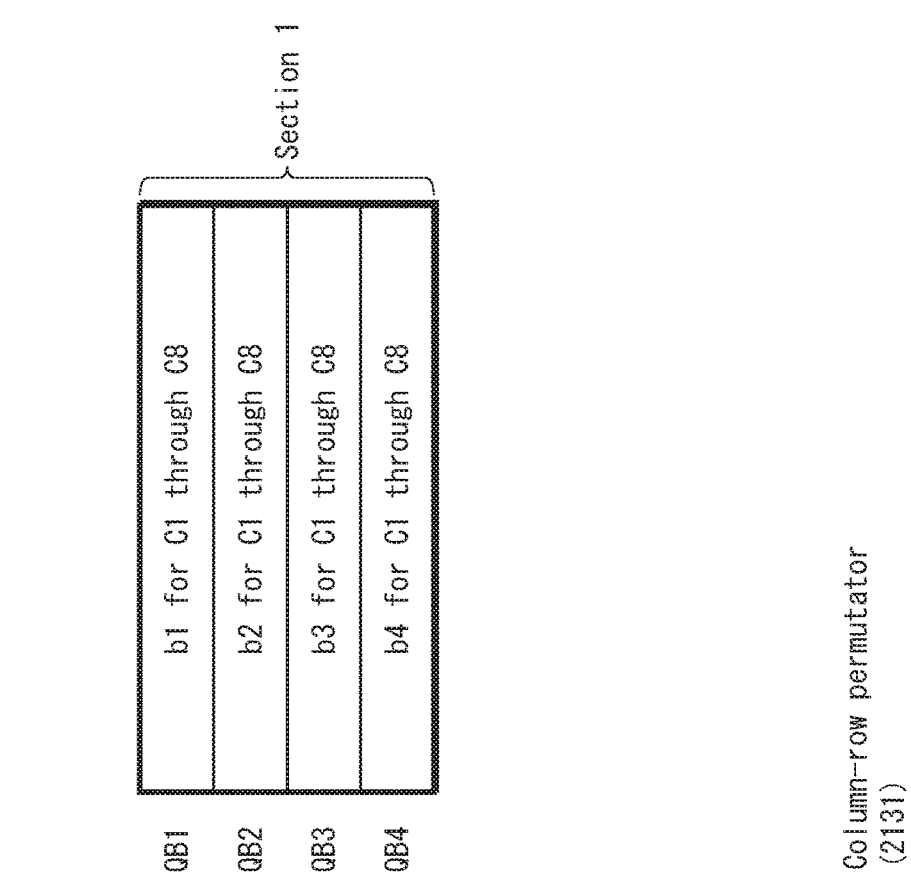
FIG. 21B illustrates a mapping function of the section permutator shown in FIG. 21A.
Figure 21A:
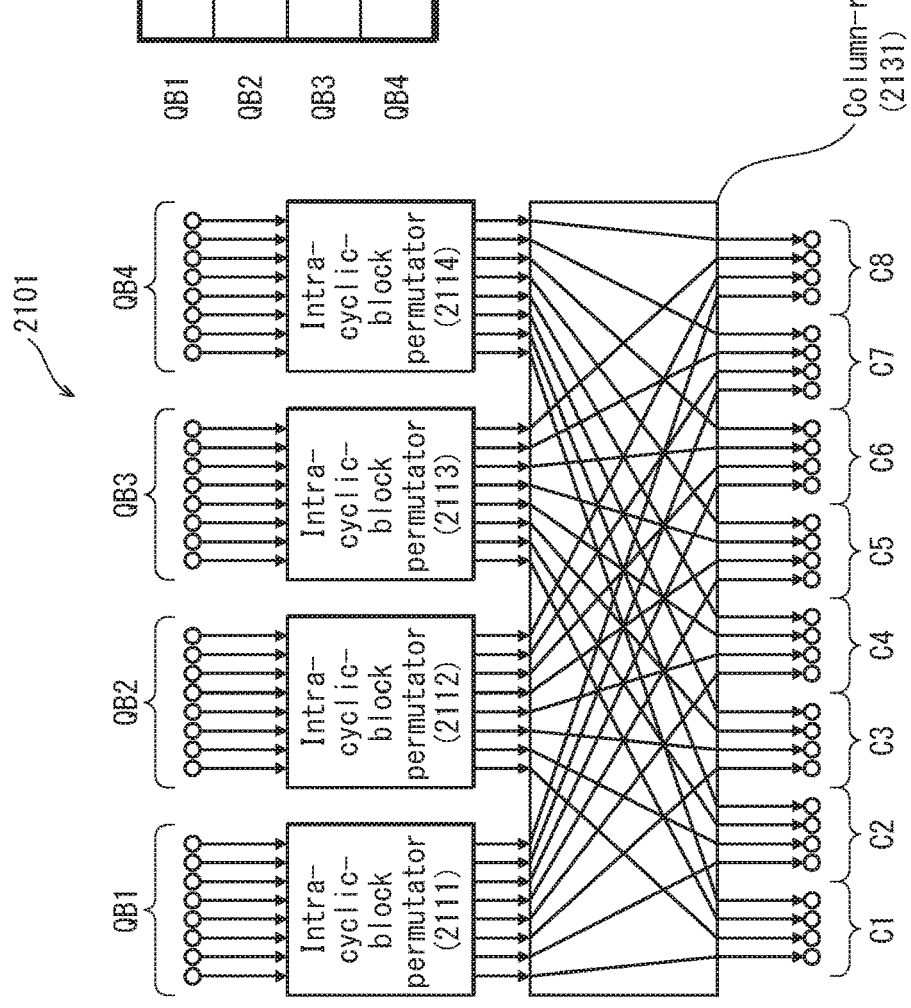
FIG. 21A is a block diagram showing the configuration of a section permutator performing the section permutation illustrated in FIG. 20.

FIG. 21A structurally illustrates the section permutator of FIG. 20.

The section permutator 2101 includes intra-cyclic-block permutators 2111 through 2114 and a column-row permutator 2131. Rather than providing four intra-cyclic-block permutators, for example, a single intra-cyclic-block permutator may be provided and perform the four intra-cyclic-block permutation processes, described later, switching therebetween over time.

The intra-cyclic-block permutators (2111-2114) each perform an intra-cyclic-block permutation on the Q-bit (8-bit) cyclic blocks (QB1-QB4). The intra-cyclic-block permutations applied to the cyclic blocks in each section may all apply the same permutation rules, may each apply different permutation rules, or may involve a subset of the sections applying identical permutation rules while other differ.

The column-row permutator 2131 performs a column-row permutation on each group of M×Q (=32) bits. Specifically, the column-row permutator 2131 writes the M×Q bits row-wise into a M×Q (8×4) matrix, then reads the M×Q, bits column-wise therefrom, thus applying the column-row permutation. The column-row permutation applied by the column-row permutator 2131 resembles the permutation applied to the 12×1350 matrix shown in FIGS. 9A and 9B, where Q columns and M rows are used, the writing process occurs column-wise, and the reading process occurs row-wise.

FIG. 21B is a structural representation of the section permutator shown in FIG. 21A. In FIG. 21 B, the constellation words of M=4 bits are each denoted b1 through b4.

However, a variation in which the intra-cyclic-block permutation process is not part of the section permutation process is also plausible.

Figure 22A:
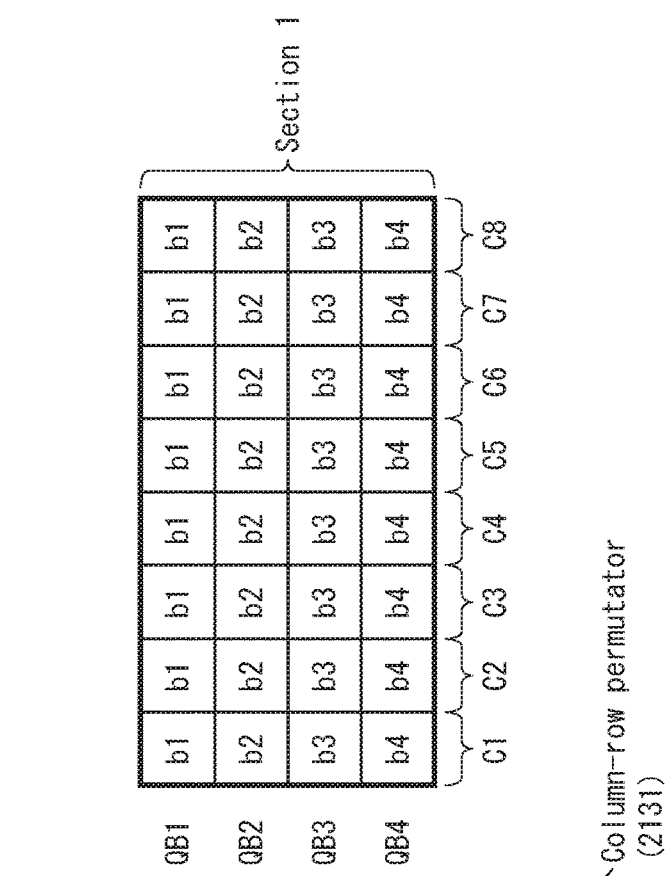
FIG. 22A is a block diagram showing an alternate configuration of a section permutator performing the section permutation illustrated in FIG. 20.
Figure 22B:
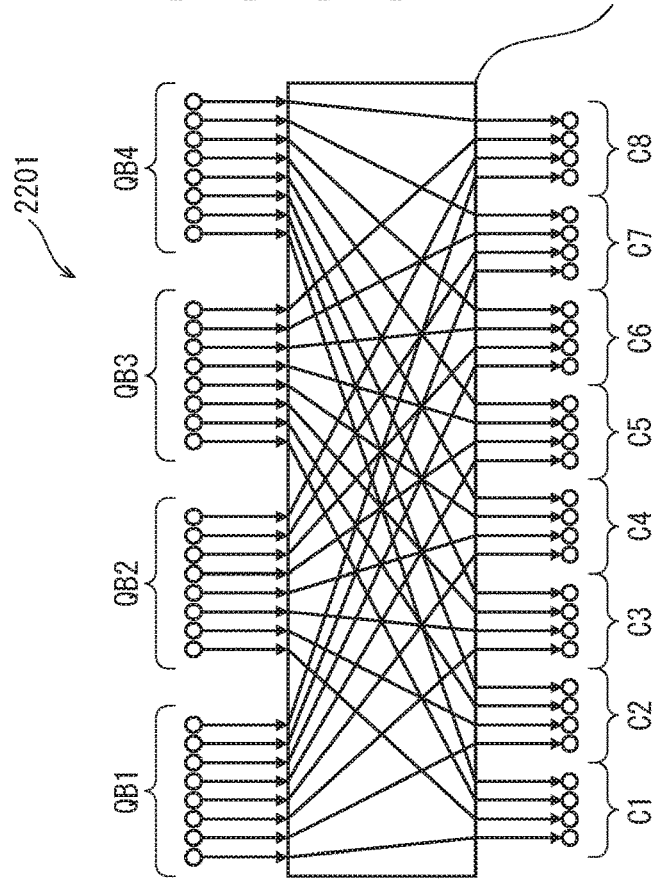
FIG. 22B illustrates a mapping function of the section permutator shown in FIG. 22A.

For example, a section permutation implemented without executing the intra-cyclic-block permutation and a structure of mapping by the section permutator are shown in FIGS. 22A and 22B. The section permutator 2201 includes a column-row permutator 2131 and performs a simple column-row permutation. In FIG. 22B, the constellation words of M=4 bits are each denoted b1 through b4.

The section permutation described in FIGS. 21A, 21B, 22A and 22B may be applied to cyclic blocks QB5-QB8 and QB9-QB12.

Figure 23:
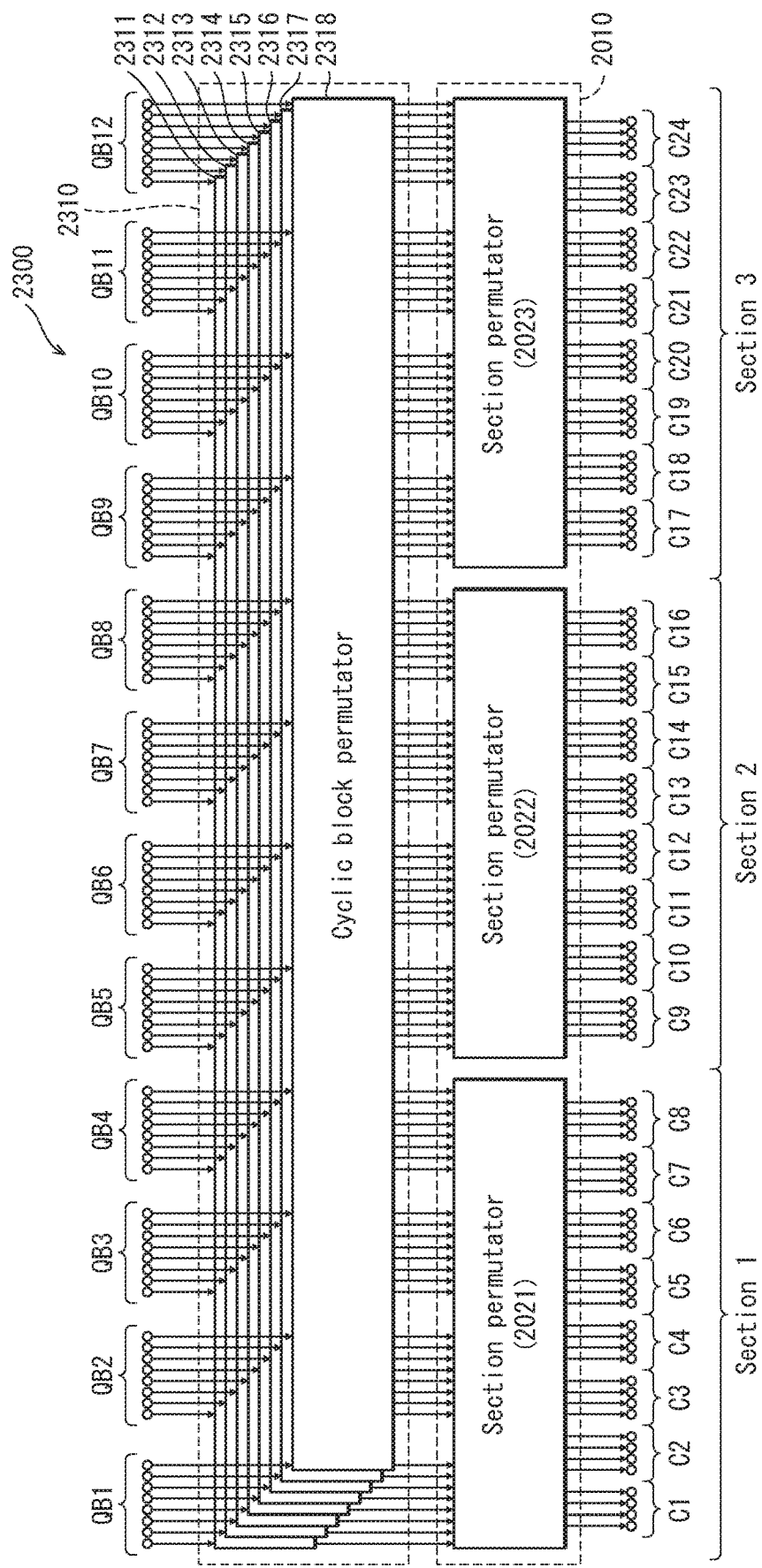
FIG. 23 is a block diagram showing the configuration of an interleaver pertaining to another Embodiment.

Advantageously, an additional cyclic block permutation may be applied to the N cyclic blocks before the bit interleaver performs the section permutation. FIG. 23 is a structural diagram of the additional cyclic block permutation applied by the bit interleaver. In this context, the cyclic block permutation plays a role similar to that of the permutation performed by the bit-to-cell demultiplexer in the DVB-T2 standard.

The bit interleaver 2300 shown in FIG. 23 includes a cyclic block permutator 2310 and a bit permutator 2010 (which in turn includes section permutators 2021-2023).

The cyclic block permutator 2310 performs cyclic block permutations 2311-2318 on the cyclic blocks QB1-QB12. Here, the cyclic block permutations 2311-2318 all follow the same permutation rules.

The cyclic block permutation performed on the N cyclic blocks is particularly advantageous in enabling optimized mapping of the LDPC codeword bits onto the constellation bits, resulting in optimized performance.

Figure 24:
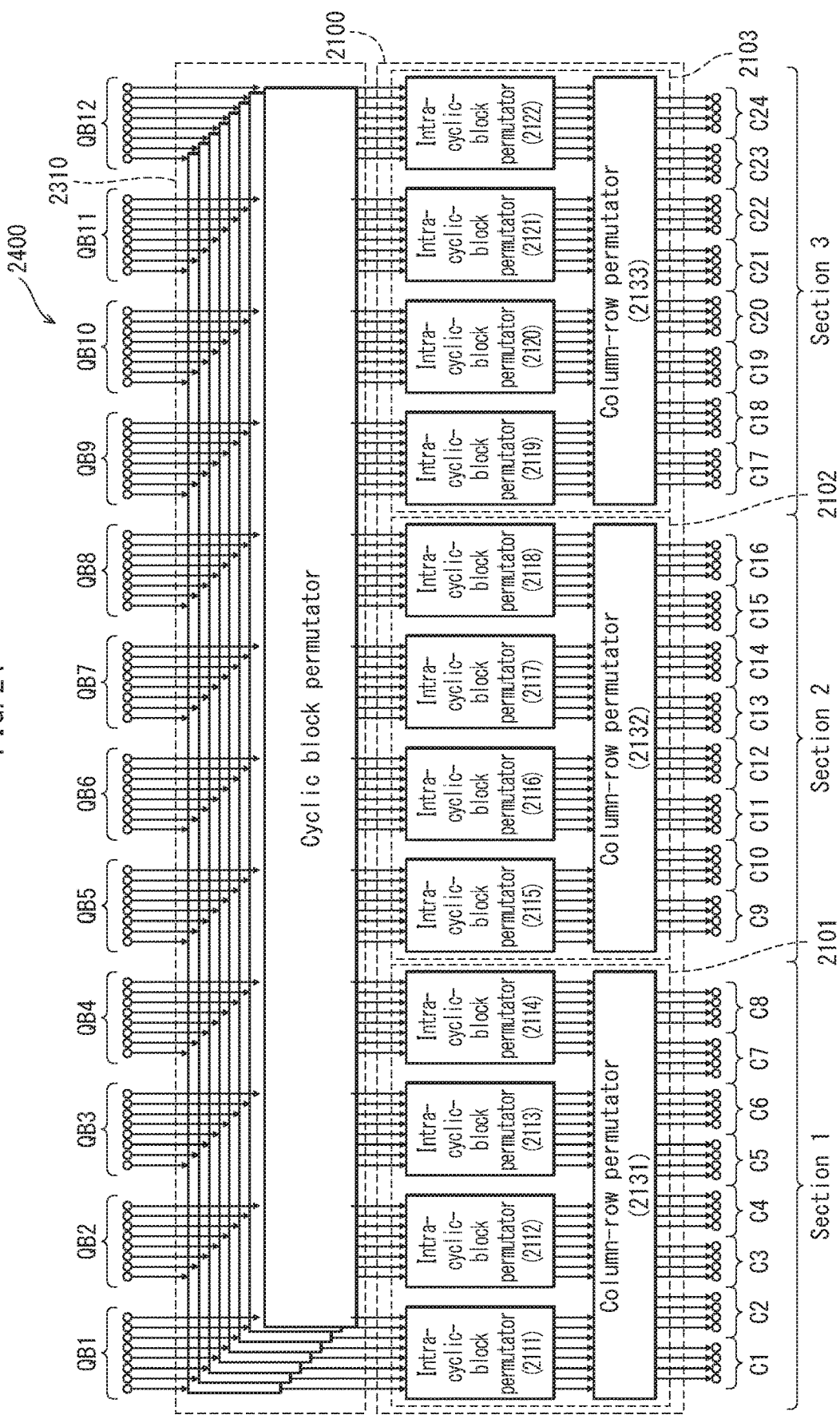
FIG. 24 is a block diagram showing the configuration of the bit interleaver shown in FIG. 23.

FIG. 24 is a schematic block diagram of the bit interleaver 2300 shown in FIG. 23. The bit interleaver 2400 shown in FIG. 24 includes three stages, A, B, and C.

Stage A: (inter) cyclic block permutation
Stage B: intra-cyclic-block permutation
Stage C: column-row permutation The (inter) cyclic block permutation is applied to the N cyclic blocks making up the codeword, the intra-cyclic-block permutation is applied to the Q bits of each cyclic block, and the column-row permutation is applied to the M×Q sections.

The bit interleaver 2400 shown in FIG. 24 includes the cyclic block permutator 2310 and the bit permutator 2010 (which in turn includes the section permutators 2101-2103). The section permutator 2101 (2102, 2013) includes the intra-cyclic-block permutators 2111-2114 (2115-2118, 2119-2122) and the column-row permutator 2131 (2132, 2133).

In the bit interleaver 2400, the (inter) cyclic block permutation is performed by the cyclic block permutator 2310 (stage A), the intra-cyclic-block permutation is performed by the intra-cyclic-block permutators 2111-2122 (stage B), and the column-row permutation is performed by the column-row permutators 2131-2133 (stage C).

The intra-cyclic-block permutators 2111-2122 may be removed from the bit interleaver 2400 shown in FIG. 24, such that the bit interleaver is configured not to perform the intra-cyclic-block permutation. Also, the bit interleaver 2400 may perform the (inter) cyclic block permutation before the intra-cyclic-block permutation rather than after the intra-cyclic-block permutation, or may perform the (inter) cyclic block permutation before and after the intra-cyclic-block permutation.

The intra-cyclic-block permutators may have similar structures. This is advantageous in that the intra-cyclic-block permutators are thus implementable using identical resources (e.g., hardware blocks). Alternatively, the intra-cyclic-block permutations may consist of cyclical shifts, which allow for efficient hardware implementation using barrel shifters. An implementation using the barrel shifters in the LDPC decoder is also possible.

Figure 25:
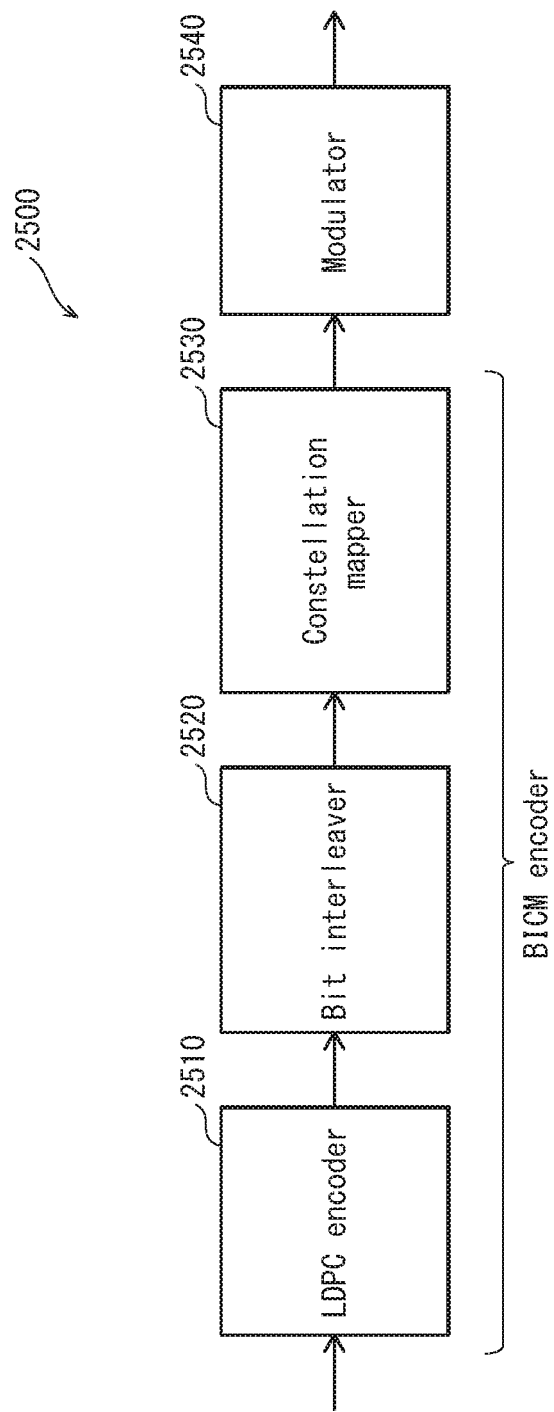
FIG. 25 is a block diagram of a transmitter pertaining to a further Embodiment of the present disclosure.

The following describes a transmitter that includes the bit interleaver performing a bit interleaving process that satisfies Conditions 1 and 2, with reference to FIG. 25.

FIG. 25 is a block diagram of a transmitter pertaining to a further Embodiment of the present disclosure. As shown in FIG. 25, a transmitter 2500 includes a BICM encoder (which in turn includes an LDPC encoder 2510, a bit interleaver 2520, and a constellation mapper 2530) and a modulator 2540.

The LDPC encoder 2510 encodes input blocks into codewords using QC-LDPC codes, and then transmits the codewords to the bit interleaver 2520.

The bit interleaver 2520 receives the codeword of QC-LDPC code from the LDPC encoder 2510. The codeword is made up of N=12 cyclic blocks, each cyclic block including Q=8 bits. The bit interleaver 2520 performs interleaving on the bits of the codewords so as to permute the bits of each of the codewords. The bit interleaver 2520 divides the interleaved codeword into a plurality of constellation words, each made up of M=4 bits and indicating one of $2^M=16$ constellation points, then outputs the constellation words to the constellation mapper 2530. The bit interleaver 2520 may apply the bit interleaving process discussed with reference to FIGS. 19 through 22A and 22B, or may apply a variant bit permutation process. Also, the bit interleaver 2520 may apply an additional cyclic block permutation process, such as the process discussed with reference to FIGS. 23 and 24 or a variation thereof.

The constellation mapper 2530 receives the constellation words from the bit interleaver 2520 and performs constellation mapping on the constellation words so received.

The modulator 2740 generates a transmission signal using orthogonal frequency division multiplexing (hereinafter, OFDM) or similar.

Figure 26:
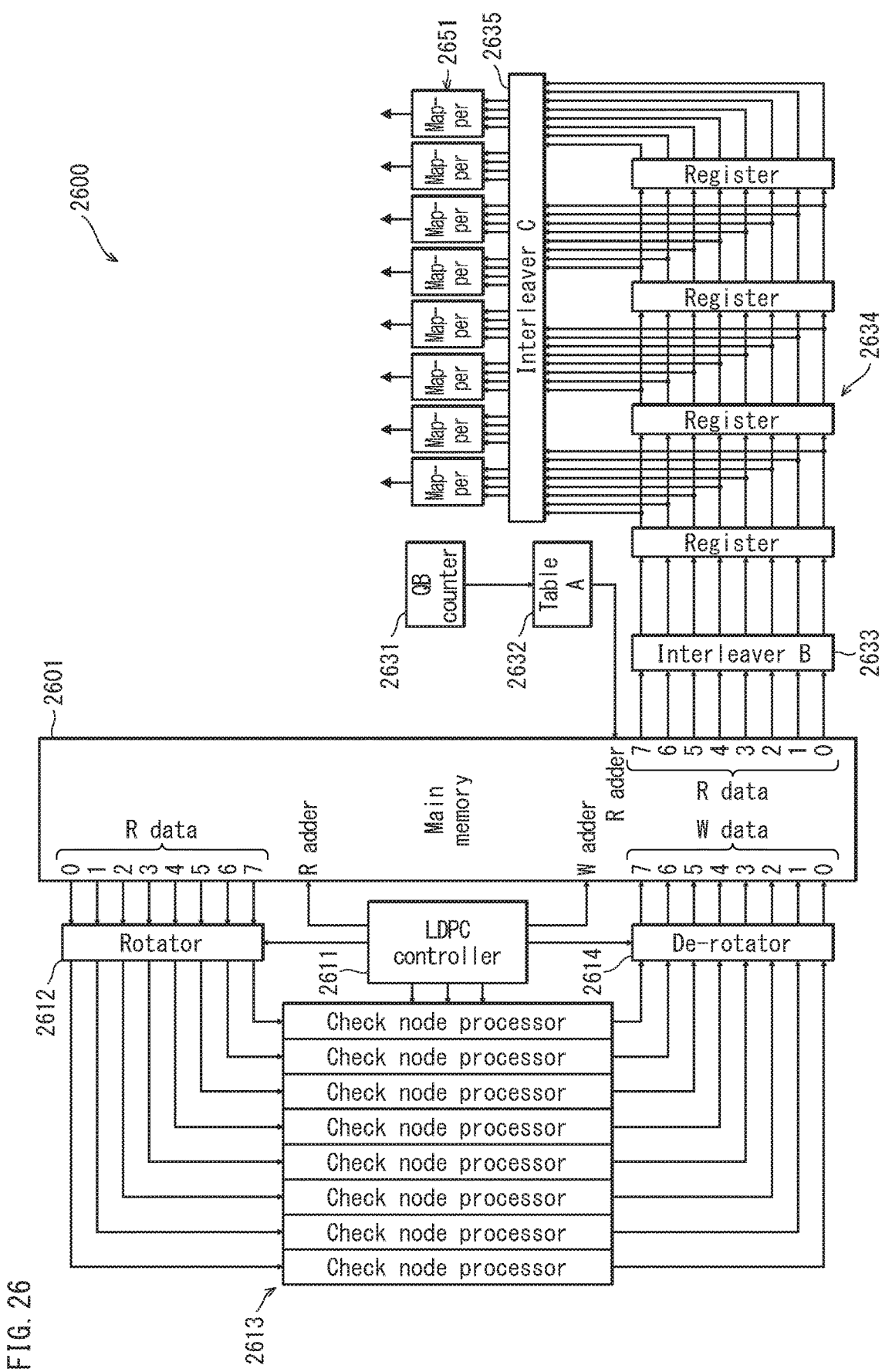
FIG. 26 is a block diagram showing the configuration of a BICM encoder pertaining to a further Embodiment.

The following describes a BICM encoder that includes the bit interleaver performing a bit interleaving process that satisfies Conditions 1 and 2, with reference to FIG. 26.

FIG. 26 is a block diagram of an example BICM encoder pertaining to a further Embodiment of the disclosure. In FIG. 26, the BICM encoder 2600 corresponds to the above-given parameters (i.e., Q=8, N=12, M=4).

The BICM encoder 2600 shown in FIG. 26 includes a main memory 2601, an LDPC controller 2611, a rotator 2612, a check node processor group 2613, a de-rotator 2614, a QB counter 2631, table A 2632, interleaver B 2633, a register group 2634, interleaver C 2635, and a mapper group 2651.

In FIG. 26, given that Q=8, the main memory 2601 reads eight bits at a time, the check node processor group 2613 includes eight check node processors, and the mapper group 2651 includes eight mappers. Also, given that M=4, the register group 2634 includes four registers.

The main memory 2601 receives a sequence of bits for transmission from, for example, the (non-diagrammed) input processor, and stores the received bit sequence.

The LDPC controller 2611 outputs a read address to the main memory 2601. The main memory 2601 accordingly outputs the bit sequence, eight bits at a time beginning with the lead bit, to the rotator 2612. The rotator 2612 is controlled by the LDPC controller 2611 to perform a predetermined number of cyclical shifts on the eight bits supplied thereto by the main memory 2601, and then outputs the eight cyclically-shifted bits to the check node processors of the check node processor group 2613, one bit at a time, the bits and the check node processors being in one-to-one correspondence. Each check node processer of the check node processor group 2613 is controlled by the LDPC controller 2611 to perform check node processing on each bit input thereto, then outputs the results to the de-rotator 2614. The de-rotator 2614 is controlled by the LDPC controller 2611 to perform a predetermined number of cyclic shifts on the eight bits received from the check node processor group 2613 so as to cancel the cyclic shift applied by the rotator 2612, and then outputs the eight shifted bits to the main memory 2601. The LDPC controller 2611 outputs a write address to the main memory 2601. The main memory 2601 accordingly stores the eight bits supplied thereto by the de-rotator 2614. The LDPC controller 2611, the rotator 2612, the check node processor group 2613, and the de-rotator 2614 make up the BICM encoder in the LDPC encoder 2510 shown in FIG. 25.

The QB counter 2631 counts from 0 to 11 and outputs the counter value to table A 2632. The count operation of the QB counter 2631 is defined in consideration of N=12.

Table A 2632 is a simple look-up table in which the cyclic block permutation rules are stored. That is, table A 2632 stores N=12 pieces of cyclic block read order information (information associating a different cyclic block with each of the 12 counter values from the QB counter 2631). Table A 2632 outputs a read address to the main memory 2601 such that the bits of one cyclic block (i.e., Q=8 bits) corresponding to the counter value supplied by the QB counter 2631 are supplied from the main memory 2601 to interleaver B 2633. Thus, the main memory 2601 outputs the bits of one cyclic block corresponding to the counter value of the QB counter 2631 to interleaver B 2633. The processing using table A 2632 is executed as the cyclic block permutation process (stage A).

Interleaver B 2633 performs a predetermined number of cyclical shifts on the bits of the cyclic block supplied by the main memory 2601, and outputs the results to a first tier register of the register group 2634. The processing by interleaver B 2633 is executed as the intra-cyclic-block permutation process (stage B). Each register in the register group 2634 stores one cyclic block of bits with timing matching the reception of a control pulse, and outputs the cyclic block of bits before receiving the next control pulse.

When the QB counter 2631 performs the aforementioned process for counter values 0 through 3, the bits of four cyclic blocks (i.e., 32 bits) are input to interleaver C 2635. At this time, interleaver C 2635 interleaves the bits of the four cyclic blocks input thereto, and the mappers of the mapper group 2651 output one constellation word of bits (i.e., M=4 bits). Through the interleaving process, four bits, i.e., one from each of the four registers in the register group 2634, are supplied to each mapper. This processing by interleaver C 2635 is executed as the column-row permutation process (stage C).

The QB counter 2631, table A 2632, interleaver B 2633, the register group 2634, and interleaver C 2635 make up the bit interleaver 2520 of the BICM encoder shown in FIG. 25.

The mappers of the mapper group 2651 each map four bits supplied thereto from interleaver C 2635 to a constellation, then output the results. The mapper group 2651 makes up the constellation mapper 2530 of the BICM encoder shown in FIG. 25.

For each codeword, the above-described set of processes is applied three times, once each for counter values 0-3, 4-7, and 8-11 of the QB counter 2631.

The Embodiment depicted in FIG. 26 includes Q mappers operating in parallel. However, the mappers are also realizable as a BICM encoder so as to decrease or increase the parallelism. For example, the number of parallel interleaver sections in the bit interleaver, i.e., the quotient of N/M, obviously may be increased so as to easily enhance parallelism. Such methods enable the parallelism to be optimized by parallelizing the Q×N/M mappers. Implementing such parallelism, without drawbacks, in the bit interleaver is beneficial.

Figure 27:
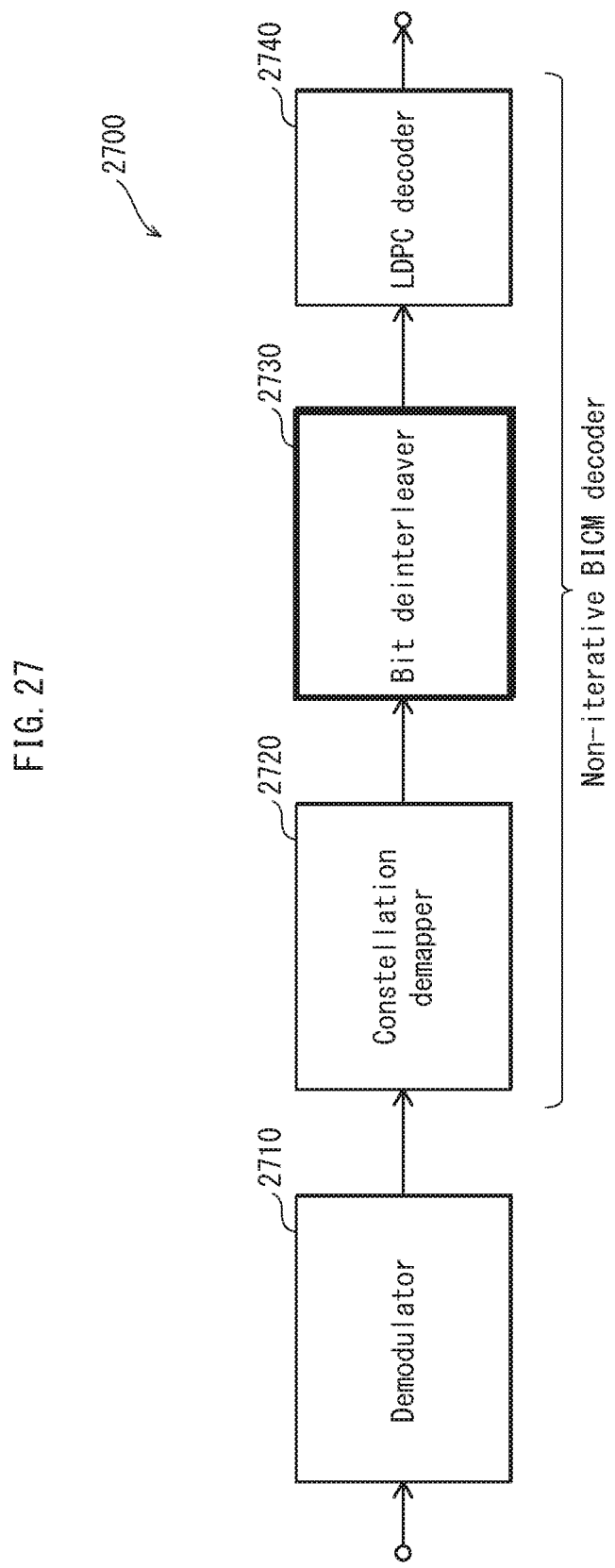
FIG. 27 is a block diagram of an example receiver, including a non-iterative BICM decoder, pertaining to a further Embodiment of the disclosure.

The following describes a receiver receiving signals from a transmitter that includes the bit interleaver performing a bit interleaving process that satisfies Conditions 1 and 2, with reference to FIG. 27.

FIG. 27 is a block diagram of an example receiver, including a non-iterative BICM decoder, pertaining to a further Embodiment of the disclosure. The receiver performs the transmitter operations in reverse.

The receiver 2700 shown in FIG. 27 includes a demodulator 2710 and a non-iterative BICM decoder (which in turn includes a constellation demapper 2720, a bit deinterleaver 2730, and an LDPC decoder 2740).

The demodulator 2710 performs a demodulation process through OFDM, for example, and outputs the demodulated results.

The constellation demapper 2720 of the non-iterative BICM decoder generates a soft bit sequence by applying a demapping process to the input from the demodulator 2710, and outputs the soft bit sequence so generated to the constellation demapper 2730. The soft bits are a measure of probability that a given bit is a zero-bit or a one-bit. Typically, the soft bits are represented as log-likelihood ratios (hereinafter, LLRs), defined as follows.

$$LLR(b) = \ln[p(b=0)/p(b=1)]$$

where p(b=0) indicates the probability of the given bit b being a zero-bit, and p(b=1) represents the probability of the given bit b being a one-bit. Of course, p(b=0)+p(b=1)=1.

The bit deinterleaver 2730 performs an interleaving process (i.e., a bit de-interleaving process) on the soft bit sequence output from the constellation demapper 2720 so as to cancel the bit interleaving process applied to the bit sequence by the bit interleaver 2730 in the transmitter illustrated in FIG. 25.

The LDPC decoder 2740 receives the soft bit sequence deinterleaved by the bit deinterleaver 2730, and performs an LDPC decoding process using the soft bit sequence so received.

Figure 28:
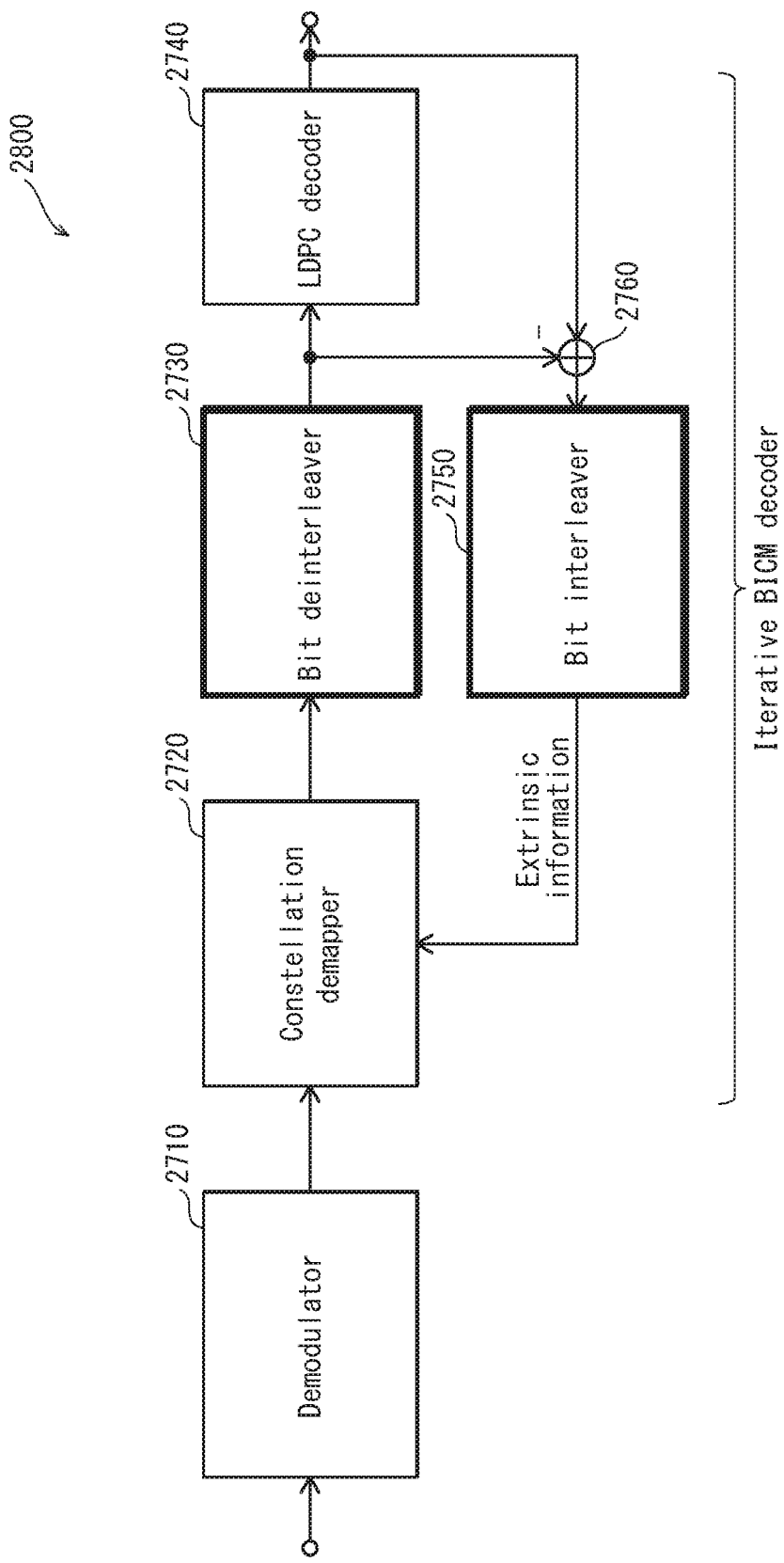
FIG. 28 is a block diagram showing the configuration of a receiver including an iterative BICM decoder, pertaining to a further Embodiment.

One improved technique offering significant performance gains is iterative BICM decoding. FIG. 28 illustrates an iterative BICM decoder.

FIG. 28 is a block diagram of an example receiver, including an iterative BICM decoder, pertaining to a further Embodiment of the disclosure. The receiver performs the transmitter operations in reverse.

As shown in FIG. 28, a receiver 2800 includes the demodulator 2710 and an iterative BICM decoder (which in turn includes the constellation demapper 2720, the bit deinterleaver 2730, the LDPC decoder 2740, a subtractor 2760, and a bit interleaver 2750).

The receiver 2800 of FIG. 28 has the constellation demapper 2720 performing a constellation demapping process, the bit deinterleaver 2730 performing a bit deinterleaving process, and the LDPC decoder 2740 performing an LDPC decoding process.

After one or more LDPC decoding iterations, extrinsic information, obtained by the subtractor 2760 subtracting the input to the LDPC decoder 2740 from the output of the LDPC decoder 2740, is output to the bit interleaver 2750. The bit interleaver 2750 performs an interleaving process on the extrinsic information using the same interleaving rules as those applied to the bit sequence by the bit interleaver of the transmitter depicted in FIG. 25. The bit interleaver 2750 then feeds back the interleaved extrinsic information to the constellation demapper 2720. The constellation demapper 2720 uses the extrinsic information so fed back as a-priori information to compute more reliable LLR values. The bit deinterleaver 2730 then performs an interleaving process on the newly computed LLR values (i.e., a bit de-interleaving process) so as to cancel the bit interleaving process applied to the bit sequence by the bit interleaver in the transmitter depicted in FIG. 25 and restore the original order of the bit sequence. The LDPC decoder 2740 uses the LLR values so de-interleaved in the LDPC decoding process.

As shown in FIG. 28, an iterative decoding loop is made up of four elements, namely the constellation demapper 2720, the bit deinterleaver 2730, the LDPC decoder 2740, and the bit interleaver 2750. The bit deinterleaver 2730 and the bit interleaver 2750 have beneficially very low latency, ideally zero, and low complexity. This results in a more efficient receiver implementation. The bit deinterleaver 2730 and the bit interleaver 2750 described above satisfy both of these conditions.

FIG. 29 illustrates an iterative BICM decoder realizing very efficient parallel implementation.

FIG. 29 is a block diagram of an example BICM decoder pertaining to a further Embodiment of the disclosure. In FIG. 29, the BICM decoder 2900 corresponds to the above-given parameters (i.e., Q=8, N=12, M=4).

As shown, the BICM decoder 2900 includes a main LLR memory 2901, a buffer LLR memory 2902, an LDPC controller 2911, a rotator 2912, a check node processor group 2913, a de-rotator 2914, a QB counter 2931, table A 2932, a subtractor group 2933, interleaver B 2934, register group 2935, interleaver C 2936, a demapper group 2937, deinterleaver C 2938, register group 2939, deinterleaver B 2940, and a delayer 2941.

In FIG. 29, given that Q=8, the main LLR memory 2901 and the buffer LLR memory 2902 each read eight LLR values at a time, the check node processor group 2913 includes eight check node processors, and the demapper group 2951 includes eight demappers. Also, given that M=4, the register groups 2935 and 2972 each include four registers.

The demappers in the demapper group 2937 each perform a demapping process on the output of a demodulator (not diagrammed), then outputs the LLR values so obtained to deinterleaver C 2938. The demapper group 2937 makes up the constellation demapper 2720 of the iterative BICM decoder shown in FIG. 28.

Deinterleaver C 2938 applies a deinterleaving process to the LLR values (i.e., a new interleaving process cancelling the interleaving process applied by the transmitter during stage C), then outputs the deinterleaved LLR values to the registers of the register group 2939. Each register stores one cyclic block of LLR values (i.e., eight LLR values). In register group 2939, the cyclic block of LLR values stored by each register is sequentially output to a later tier such that the content of each register is sequentially updated. Deinterleaver B 2940 applies a deinterleaving process to the cyclic block of (eight) LLR values (i.e., a new interleaving process cancelling the interleaving process applied by the transmitter during stage B), then writes the results to the main LLR memory 2901 and the buffer LLR memory 2902 in accordance with table A 2932 (discussed later). An interleaving process cancelling the interleaving process applied by the transmitter during stage A is achieved by this writing to the main LLR memory 2901 and the buffer LLR memory 2902 in accordance with the content of Table A 2932.

Thus, the main LLR memory 2901 stores the post-deinterleaving LLR values, and is also used by the LDPC decoder (i.e., the LDPC controller 2911, the rotator 2912, the check node processor group 2913, and the de-rotator 2914). The LDPC decoding process is an iterative process involving one or more iterations. In each LDPC decoding iteration, the LLR values in the main LLR memory 2901 are updated. In order to compute the extrinsic information needed for iterative BICM decoding, the old LLR values are saved in the buffer LLR memory 2902.

The following describes the LDPC decoder operations.

The LDPC controller 2911 outputs the read address to the main LLR memory 2901 in accordance with the parity-check matrix of the LDPC codes. Thus, the main LLR memory 2901 sequentially outputs one cyclic block of LLR values to the rotator 2912. The rotator 2912 is controlled by the LDPC controller 2911 to perform a predetermined number of cyclical shifts on the cyclic block of LLR values supplied sequentially by the main LLR memory 2901, then outputs the LLR values so shifted to the check node processors of the check node processor group 2913 one at a time. The check node processors of the check node processor group 2913 are controlled by the LDPC controller 2911 to perform a check node process on the sequence of LLR values sequentially input thereto. Next, the check node processors of the check node processor group 2913 are controlled by the LDPC controller 2911 to sequentially output the LLR values resulting from the check node process. The de-rotator 2914 is controlled by the LDPC controller 2911 to performs a predetermined number of cyclic shifts cancelling the cyclic shift applied to the cyclic block sequentially received from the check node processor group 2913 by the rotator 2912, then sequentially outputs the shifted results to the main LLR memory 2901. The LDPC controller 2911 outputs the write address to the main LLR memory 2901 in accordance with the parity-check matrix of the LDPC codes. Thus, the main LLR memory 2901 stores the cyclic block of results sequentially supplied thereto by the de-rotator 2914. The LDPC controller 2911 repeatedly executes the above-described processing in accordance with the parity-check matrix of the LDPC codes.

After a predetermined number of LDPC iterations, a BICM iteration is performed. The LDPC and BICM iterations are also respectively referred to as inner and outer iterations. These two types of iterative may also overlap in some implementations. This enables the speed of convergence to be increased. The BICM and LDPC decoding processes are well known in the field, and the details thereof are thus omitted.

The QB counter 2931 counts from 0 to 11 and outputs the counter value to table A 2932. The count operation of the QB counter 2931 is defined in consideration of N=12.

Table A 2932 is a simple look-up table in which the cyclic block permutation rules are stored. That is, table A 2932 stores N=12 pieces of cyclic block read (and write) order information (i.e., with information associating a different cyclic block with each of the 12 counter values from the QB counter 2631). Table A 2932 outputs the read address to the main LLR memory 2901 and to the buffer LLR memory 2902 such that one cyclic block of LLR values corresponding to the counter value supplied by the QB counter 2931 are supplied to the subtractor group 2933 by the main LLR memory 2901 and to the buffer LLR memory 2902. Thus, the main LLR memory 2901 and the buffer LLR memory 2902 each output a cyclic block of LLR values corresponding to the counter value of the QB counter 2931 to the subtractor 2933. The delayer 2941 makes a delay adjustment such that the position of the LLR value read from the main LLR memory 2901 and the buffer LLR memory 2902 match the write position of the same LLR values to the main LLR memory 2901 and the buffer LLR memory 2902. The processing using table A 2932 is executed as the cyclic block permutation process (stage A).

The subtractor 2933 in the subtractor group subtracts the output of the buffer LLR memory 2902 from the output of the main LLR memory 2901, then outputs the extrinsic information for one cyclic block thus obtained (i.e., eight pieces of extrinsic information) to interleaver B 2934.

Interleaver B 2634 performs a predetermined number of cyclical shifts on the pieces of extrinsic information for one of the cyclic blocks supplied by the subtractor 2933, and outputs the results to a first tier register of the register group 2935. The processing performed by interleaver B 2934 corresponds to the intra-cyclic-block permutation (stage B). Each register in the register group 2935 stores eight bits with timing matching the reception of a control pulse, and outputs the eight bits before receiving the next control pulse.

When the QB counter 2631 performs the aforementioned process for counter values 0 through 3, the extrinsic information for four cyclic blocks (i.e., 32 pieces of extrinsic information) are input to interleaver C 2936. At this time, interleaver C 2936 performs an interleaving process on the extrinsic information input thereto for four cyclic blocks, then outputs one constellation word of extrinsic information (i.e., M=4 pieces of extrinsic information) to each demapper of the demapper group 2937. Through the interleaving process, the four pieces of extrinsic information are supplied to the demappers of the demapper group 2951 from the four registers in register group 2935, one at a time. This processing by interleaver C 2936 is executed as the column-row permutation process (stage C).

The QB counter 2931, table A 2932, interleaver B 2934, the register group 2935, and interleaver C 2936 make up the bit interleaver 2750 of the BICM decoder shown in FIG. 28.

The demappers of the demapper group 2937 uses the four pieces of extrinsic information supplied by interleaver C 2936 as a-priori information to perform a demapping process, then output the resulting LLR values to deinterleaver C 2938.

Deinterleaver C 2938 applies a deinterleaving process to the LLR values (i.e., a new interleaving process cancelling the interleaving process applied by the transmitter during stage C), then outputs the deinterleaved LLR values to the registers of the register group 2939. Each register stores one cyclic block of LLR values (i.e., eight LLR values). In register group 2939, the cyclic block of LLR values stored by each register is sequentially output to a later tier such that the content of each register is sequentially updated. Deinterleaver B 2940 applies a deinterleaving process to the cyclic block of (eight) LLR values (i.e., a new interleaving process cancelling the interleaving process applied by the transmitter during stage B), then writes the results to the main LLR memory 2901 and the buffer LLR memory 2902. The main LLR memory 2901 and the buffer LLR memory 2902 receive the write address from table A 2932 via the delayer 2941, then store one cyclic block of LLR values (i.e., eight LLR values) received from the deinterleaver 2940 in accordance with the received write address. An interleaving process cancelling the interleaving process applied by the transmitter during stage A (i.e., a deinterleaving process) is achieved by this writing in accordance with the content of table A 2932.

For each codeword, the above-described set of processes is applied three times, once each for counter values 0-3, 4-7, and 8-11 of the QB counter 2931.

The QB counter 2931, table A 2932, deinterleaver B 26938, the register group 2939, and interleaver C 2940 make up the bit interleaver 2730 of the BICM decoder shown in FIG. 28.

Interleaver B 2934 and deinterleaver B 2940 are reconfigurable. This requires a certain hardware cost, but this cost is minimized by attentive design. Interleaver C 2936 and deinterleaver 2938 implement the column-row permutation. This permutation is uniform for a predetermined constellation size. Thus, the cost of implementation is reduced.

The Embodiment depicted in FIG. 29 includes Q demappers operating in parallel. However, the demappers are also realizable as an iterative BICM decoder by decreasing or increasing the parallelism. For example, the number of parallel interleaver sections in the bit interleaver, i.e., the quotient of N/M, obviously may be increased so as to easily enhance parallelism. Such methods enable the parallelism to be optimized by parallelizing the Q×N/M demappers. The above-described bit interleaver has the merit of being implementable with such parallelism without trouble.

(Supplement 1)

The present disclosure is not limited to the Embodiments described above. Provided that the aims of the invention and accompanying aims are achieved, other variations are also possible, such as the following.

(1) Embodiment 1 is described above using the parameters N=12, Q=8, and M=4. However, no limitation to the parameters N, M, and Q is intended. Here, N may be any multiple of M. When N is two or more times M, the processing by the bit interleaver is divisible into a plurality of sections.

(2) In the above-described Embodiments, the constellations are described as 16-QAM (i.e., M=4). However, the constellations may be specified by other modulation methods such as QPSK and QAM, such as the circular constellations employed in the DVB-S2 standard, higher-dimensional constellations, and so on.

(3) The methods and devices discussed in the above Embodiments may be implemented as software or as hardware. No particular limitation is intended in this regard. Specifically, the above-described Embodiments may be implemented as a computer-readable medium having embodied thereon computer-executable instructions that are adapted for allowing a computer, a microprocessor, a microcontroller, and the like to execute the above-described methods. Also, the above-described Embodiments may be implemented as an Application-Specific Integrated Circuit (ASIC) or as an Field Programmable Gate Array (FPGA).

(Supplement 2)

The bit interleaving method, bit interleaver, bit deinterleaving method, bit deinterleaver, and decoder of the present disclosure, and the effects thereof, are described below.

In a first aspect of a bit interleaving method, a bit interleaving method for a communication system using quasi-cyclic low-density parity check codes comprises: a reception step of receiving a codeword of the quasi-cyclic low-density parity check codes made up of N cyclic blocks each including Q bits; a bit permutation step of applying a bit permutation process to the codeword so as to permute the bits in the codeword; and a division step of dividing the codeword, after the bit permutation process, into a plurality of constellation words, each of the constellation words being made up of M bits and indicating one of $2^M$ predetermined constellation points, wherein prior to the bit permutation process, the codeword is divided into N/M sections, each of the sections including M of the cyclic blocks, and each of the constellation words being associated with one of the N/M sections, and in the bit permutation step, the bit permutation process is applied such that the M bits in each of the constellation words include one bit from each of M different cyclic blocks in a given section associated with a given constellation word, and such that all bits of the given section are mapped to only Q of the constellation words associated with the given section.

In another aspect, a first bit interleaver for a communication system using quasi-cyclic low-density parity check codes comprises: a bit permutation unit receiving a codeword of the quasi-cyclic low-density parity check codes made up of N cyclic blocks each including Q bits, applying a bit permutation process to the codeword so as to permute the bits in the codeword, and dividing the codeword, for output after the bit permutation process, into a plurality of constellation words, each of the constellation words being made up of M bits and indicating one of $2^M$ predetermined constellation points, wherein prior to the bit permutation process, the codeword is divided into N/M sections, each of the sections including M of the cyclic blocks, and each of the constellation words being associated with one of the N/M sections, and the bit permutation unit applies the bit permutation process such that the M bits in each of the constellation words include one bit from each of M different cyclic blocks in a given section associated with a given constellation word, and such that all bits of the given section are mapped to only Q of the constellation words associated with the given section.

Accordingly, a bit interleaving process having high parallelism is realizable.

In a second aspect of the bit interleaving method, the bit permutation step includes a section permutation step of applying a section permutation process independently to each of the N/M sections so as to permute the bits in each of the sections.

Also, in a second aspect of a bit interleaver, the bit permutation unit includes a section permutation unit applying a section permutation process independently to each of the N/M sections so as to permute the bits in each of the sections.

Accordingly, a plurality of folding section permutation processes are executable in parallel.

In a third aspect of the bit interleaving method, in the section permutation step, the section permutation process is applied such that the Q bits in the given cyclic block are each mapped to a bit of an identical bit index in the Q constellation words associated with the given section that corresponds to the given cyclic block.

Also, in a third aspect of a bit interleaver, the section permutation unit applies the section permutation process such that the Q bits in the given cyclic block are each mapped to a bit of an identical bit index in the Q constellation words associated with the given section that corresponds to the given cyclic block.

Accordingly, bits of the codeword having the same importance are mapped to bits of the constellation word having the same robustness level, allowing a matching of importance and robustness level. For example, the bit of the codeword having the highest importance may be mapped to a bit of the constellation word having the highest robustness level. In such a case, high reliability is achieved at reception time for the bit of the codeword having the highest importance, resulting in greater reception capability.

In a fourth aspect of the bit interleaving method, the section permutation step includes a column-row permutation step of applying a column-row permutation process to the M×Q bits in each of the sections, so as to permute the bits in each of the sections.

In a fifth aspect of the bit interleaving method, the section permutation step includes, for each of the N/M sections: an intra-cyclic-block permutation step of applying an intra-cyclic-block permutation process independently to each of the cyclic blocks so as to permute the bits in each of the cyclic blocks, and a column-row permutation step of applying a column-row permutation process to the M×Q bits in each of the sections, so as to permute the M×Q bits after the cyclic block permutation process.

In a sixth aspect of the bit interleaving method, the column-row permutation process is equivalent to writing the M×Q bits row-wise into a matrix having Q columns and M rows, then reading the M×Q bits column-wise.

Also, in a fourth aspect of a bit interleaver, the section permutation unit includes a column-row permutation unit applying a column-row permutation process to the M×Q bits in each of the sections, so as to permute the bits in each of the sections.

Also, in a fifth aspect of a bit interleaver, the section permutation unit applies, to each of the N/M sections: an intra-cyclic-block permutation process, applied independently to each of the cyclic blocks so as to permute the bits in each of the cyclic blocks, and a column-row permutation process, applied to the M×Q bits in each of the sections so as to permute the M×Q bits after the cyclic block permutation process.

Accordingly, a column-row permutation is used in the section permutation process, thus enabling the realization of an extremely efficient section permutation process.

In a seventh aspect of the bit interleaving method, the bit interleaving method of the first aspect further comprises a cyclic block permutation step of applying a cyclic block permutation process to the cyclic blocks in the codeword so as to permute the cyclic blocks within the codeword.

Also, in a sixth aspect of a bit interleaver, the bit interleaver of the first aspect further comprises a cyclic block permutation unit applying a cyclic block permutation process to the cyclic blocks in the codeword so as to permute the cyclic blocks within the codeword.

Accordingly, the bits in the codeword are optimally mapped to the bits in the constellation word, thus enabling overall BICM optimization.

In a further aspect, a bit deinterleaving method for deinterleaving a bit stream in a communication system using quasi-cyclic low-density parity check codes comprises: a reception step of receiving a bit sequence made up of N×Q bits; and a reverse bit permutation step of applying a reverse bit permutation process to the received bit sequence so as to permute the bits in the bit sequence in order to restore the codeword of the quasi-cyclic low-density parity check codes, wherein the reverse bit permutation process reverses the bit permutation process in the bit interleaving method of the first aspect.

In an alternate aspect, a bit deinterleaver for deinterleaving a bit stream in a communication system using quasi-cyclic low-density parity check codes comprises: a reverse bit permutation unit receiving a bit sequence made up of N×Q bits, and applying a reverse bit permutation process to the received bit sequence so as to permute the bits in the bit sequence in order to restore a codeword of the quasi-cyclic low-density parity check codes, wherein the reverse bit permutation process reverses the bit permutation process applied by the bit interleaver of the first aspect.

In another aspect, a decoder for a bit interleaving and demodulating system using quasi-cyclic low-density parity check codes comprises a constellation demapper generating a soft bit sequence indicating a probability of a corresponding bit being one of a zero-bit and a one-bit; the bit deinterleaver of the alternate aspect deinterleaving the soft bit sequence; and a low-density parity check decoder decoding the deinterleaved soft bit sequence.

In yet another aspect, the decoder of the other aspect further comprises: a subtraction unit subtracting input to the low-density parity check decoder from output of the low-density parity check decoder; and the bit interleaver of the first aspect, providing the difference from the subtraction unit to the constellation demapper as feedback.

Accordingly, a bit interleaving process having high parallelism is realizable.

INDUSTRIAL APPLICABILITY

The present invention is applicable to a bit interleaver in a bit-interleaved coding and modulation system used for quasi-cyclic low-density parity codes, and to a bit deinterleaver corresponding to such a bit interleaver.

REFERENCE SIGNS LIST

2000, 2300, 2400 Bit interleaver
2010 Bit permutator
2021-2023 Section permutator
2101, 2201 Bit permutator
2111-2122 Intra-cyclic-block permutator
2131-2133 Column-row permutator
2310 Cyclic block permutator
2500 Transmitter
2510 LDPC encoder
2520 Bit interleaver
2530 Constellation mapper
2700, 2800 Receiver
2710 Constellation demapper
2720 Bit deinterleaver
2730 LDPC decoder
2740 Subtractor
2750 Bit interleaver

The invention claimed is:

1. A reception method comprising:
receiving a transmission signal through an antenna;
generating constellation words based on the transmission signal;
generating a codeword by concatenating the constellation words;
reordering bits of the codeword;
dividing the reordered bits of the codeword into bit groups;
reordering the bit groups; and
decoding bits of the reordered bit groups according to a low-density parity check coding scheme, wherein
the bits of the codeword are written into a matrix column-by-column and the written bits of the codeword are read from the matrix row-by-row in order to reorder the bits of the codeword.

2. A receiver comprising:
an antenna receiving a transmission signal;
first generating circuitry generating constellation words based on the transmission signal;
second generating circuitry generating a codeword by concatenating the constellation words;
first reordering circuitry reordering bits of the codeword and dividing the reordered bits of the codeword into bit groups;
second reordering circuitry reordering the bit groups; and
decoding circuitry decoding bits of the reordered bit groups according to a low-density parity check coding scheme, wherein
the bits of the codeword are written into a matrix column-by-column and the written bits of the codeword are read from the matrix row-by-row in order to reorder the bits of the codeword.

* * * * *